(12) United States Patent
Song et al.

(10) Patent No.: US 7,015,548 B2
(45) Date of Patent: Mar. 21, 2006

(54) THIN FILM TRANSISTOR ARRAY PANEL INCLUDING STORAGE ELECTRODE

(75) Inventors: Yu-Ri Song, Yongin (KR); Woon-Yong Park, Suwon (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/615,798

(22) Filed: Jul. 10, 2003

(65) Prior Publication Data

US 2004/0007705 A1    Jan. 15, 2004

(30) Foreign Application Priority Data

Jul. 11, 2002  (KR)  ...................... 10-2002-0040169

(51) Int. Cl.
*H01L 27/01*   (2006.01)
*H01L 27/12*   (2006.01)
*H01L 31/0392* (2006.01)

(52) U.S. Cl. ...................................... 257/347; 438/149
(58) Field of Classification Search ................. 257/79, 257/80, 83, 84, 94, 59, 72, 347, 71, 350, 257/351; 349/73; 438/149, 151, 158, 161
See application file for complete search history.

(56) References Cited

U.S. PATENT DOCUMENTS

| | | | |
|---|---|---|---|
| 6,554,407 B1 * | 4/2003 | Ikeda et al. | 347/68 |
| 6,600,540 B1 * | 7/2003 | Yamakita et al. | 349/139 |
| 2002/0195609 A1 * | 12/2002 | Yoshitake et al. | 257/81 |
| 2003/0007108 A1 * | 1/2003 | Hwang et al. | 349/43 |

* cited by examiner

*Primary Examiner*—Hoai Pham
*Assistant Examiner*—Dana Farahani

(57) ABSTRACT

A thin film transistor array panel is provided, which includes: an insulating substrate; a gate line formed on the substrate; a plurality of storage conductors formed on the substrate, each storage conductor including a plurality of branches; a gate insulating layer formed on the gate line and the storage conductor; a semiconductor layer formed on the gate insulating layer; a data conductor formed on the semiconductor layer; a passivation layer formed on the data conductor; and a pixel electrode formed on the passivation layer, wherein at most one of the branches of each storage conductor has an isolated end.

15 Claims, 35 Drawing Sheets

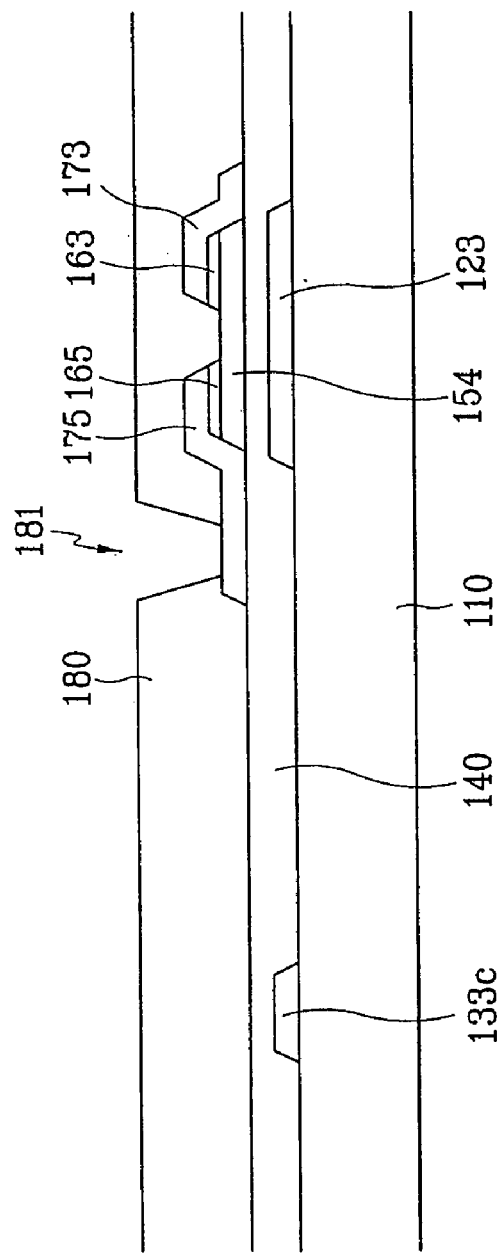

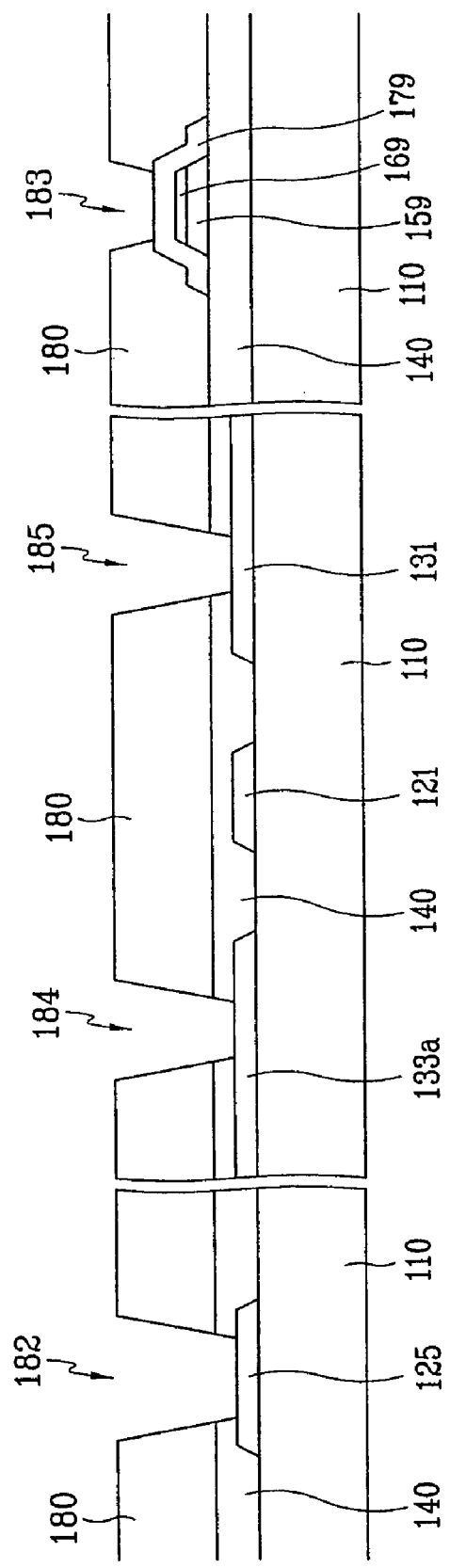

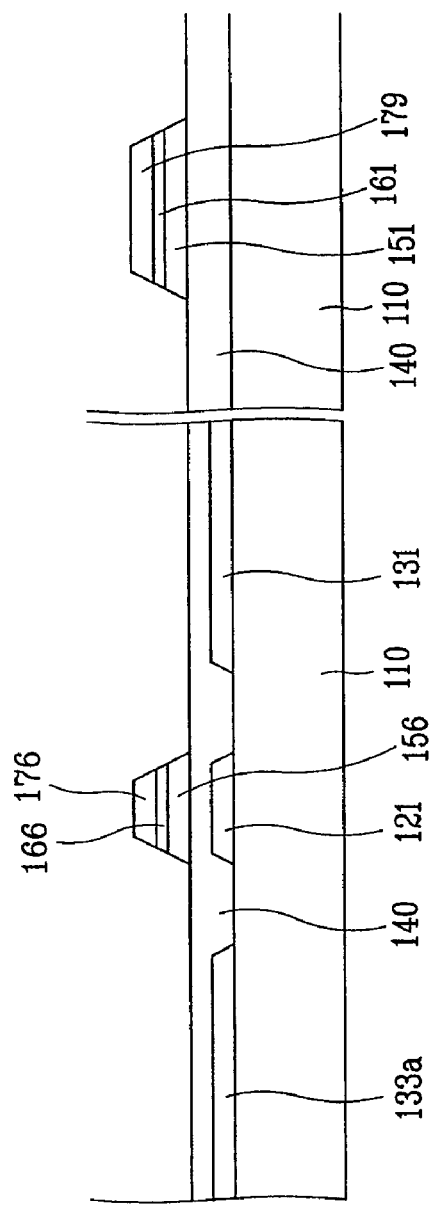

US 7,015,548 B2

THIN FILM TRANSISTOR ARRAY PANEL INCLUDING STORAGE ELECTRODE

CROSS REFERNECE TO RELATED APPLICATION

This application claims the benefit of Korean Patent Application No. 2002-40169 filed in the Korean Intellectual Property Office on Jul. 11, 2002, which is hereby incorporated by reference in its entirety for all purposes as if fully set forth herein.

BACKGROUND OF THE INVENTION (a) Field of the Invention

The present invention relates to a thin film transistor array panel including a storage electrode.

(b) Description of the Related Art

Thin film transistors (TFTs) are used as switching elements for selectively transmitting voltages to be applied to pixels of display devices such as liquid crystal displays (LCDs) and electroluminescent (EL) displays.

The LCDs are one of the most widely used flat panel displays. An LCD includes two panels provided with field-generating electrodes and a liquid crystal (LC) layer interposed therebetween. The LCD displays images by applying voltages to the field-generating electrodes to generate an electric field in the LC layer, which determines orientations of LC molecules in the LC layer to adjust polarization of incident light.

Among LCDs including field-generating electrodes on respective panels, a kind of LCDs provides a plurality of pixel electrodes arranged in a matrix at one panel and a common electrode covering an entire surface of the other panel. The image display of the LCD is accomplished by applying individual voltages to the respective pixel electrodes. For the application of the individual voltages, a plurality of three-terminal (TFTs) are connected to the respective pixel electrodes, and a plurality of gate lines transmitting signals for controlling the TFTs and a plurality of data lines transmitting voltages to be applied to the pixel electrodes are provided on the panel.

A pixel electrode and a common electrode form a liquid crystal capacitor, which stores applied voltages after turn-off of the TFT. A storage capacitor, which is connected in parallel to the liquid crystal capacitor, is provided for enhancing the voltage storing capacity. The storage capacitor is usually implemented by overlap of the pixel electrode and a storage electrode provided on the panel.

The storage electrode has a configuration which gathers electrical charges in some places and it is called charge trapping. The charge trapping causes dark spots or horizontal lines on a screen of the LCD, thereby deteriorating image quality. The dark spots are generated when displaying middle grays, and the horizontal lines extend along the extending direction of the storage electrode because the charge trapping decreases the capacitance of the storage capacitors and thus obstruct the charging of the capacitors.

SUMMARY OF THE INVENTION

A thin film transistor array panel is provided, which includes: an insulating substrate; a gate line formed on the substrate; a plurality of storage conductors formed on the substrate, each storage conductor including a plurality of branches; a gate insulating layer formed on the gate line and the storage conductor; a semiconductor layer formed on the gate insulating layer; a data conductor formed on the semiconductor layer; a passivation layer formed on the data conductor; and a pixel electrode formed on the passivation layer, wherein at most one of the branches of each storage conductor has an isolated end.

Adjacent two of the storage conductors preferably have at least two connections.

The thin film transistor array panel may further include a connection bridge connecting adjacent two of the storage conductors across the gate line.

Each storage electrode preferably includes two longitudinal branches and a plurality of oblique branches, and the branches form at least one closed loop. The number of the oblique branches and the number of the closed loops are: two oblique branches and one closed loop; three oblique branches and two closed loops; or four oblique branches and three closed loops.

The pixel electrode preferably has a plurality of cutouts, and at least one of the cutouts overlaps the storage conductors.

The data conductor may have substantially the same planar shape as the semiconductor layer except for a channel portion of the semiconductor layer.

BRIEF DESCRIPTION OF THE DRAWINGS

The above and other advantages of the present invention will become more apparent by describing preferred embodiments thereof in detail with reference to the accompanying drawings in which:

FIGS. 14A and 14B, FIGS. 16A and 16B, FIGS. 18A and 18B, and FIGS. 20A and 20B are sectional views of the TFT array panels shown in FIGS. 13, 15, 17 and 19 taken along the lines XIVA–XIVA' and XIVB–XIVB', the lines XVIA–XVIA' and XVIB–XVIeB', the lines XVIIIA–XVIIIA' and XVIIIB–XVIIIB', and the lines XXA–XXA' and XXB–XXB', respectively;

FIGS. 24A and 24B, FIGS. 27A and 27B, and FIGS. 29A and 29B are sectional views of the TFT array panels shown in FIGS. 23, 26 and 28 taken along the lines XXIVA–XXIVA' and XXIVB–XXIVB', the lines XXVI-IA–XXVIIA' and XXVIIB–XXVIIB', and the lines XXIX-A–XXIXA' and XXIXB–XXIXB', respectively.

DETAILED DESCRIPTION OF PREFERRED EMBODIMENTS

Figure 1:
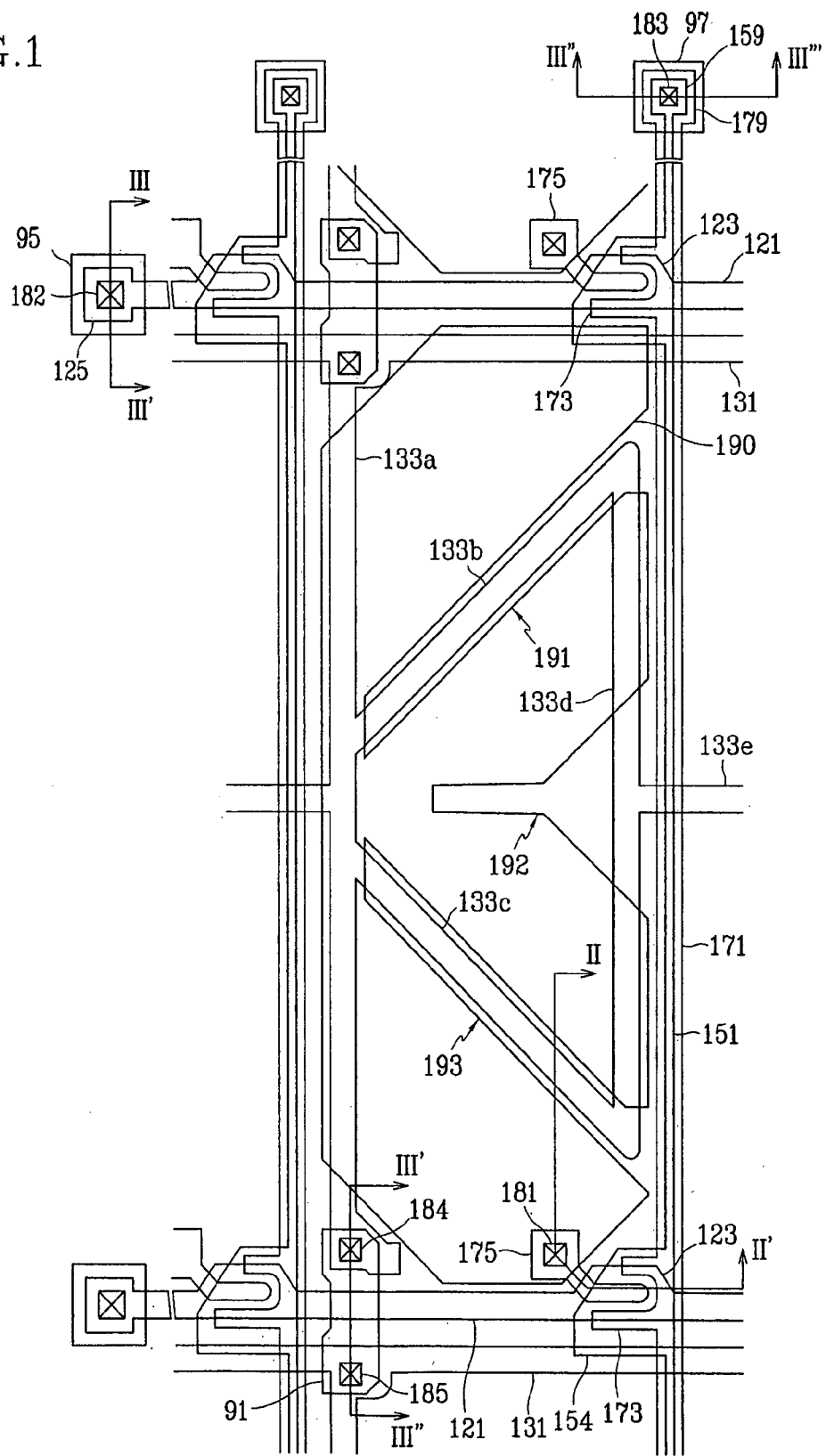
FIG. 1 is a layout view of an exemplary TFT array panel for an LCD according to an embodiment of the present invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, panels, regions, etc. are exaggerated for clarity. Like numerals refer to like elements throughout. It will be understood that when an element such as a layer, film, region or substrate is referred to as being "on" another element, it can be directly on the other element or intervening elements may also be present. In contrast, when an element is referred to as being "directly on" another element, there are no intervening elements present.

Now, TFT array panels including storage electrodes and manufacturing methods thereof according to embodiments of the present invention will be described with reference to the accompanying drawings.

A TFT array panel for an LCD according to an embodiment of the present invention will be described in detail with reference to FIGS. 1 and 2.

Figure 2:
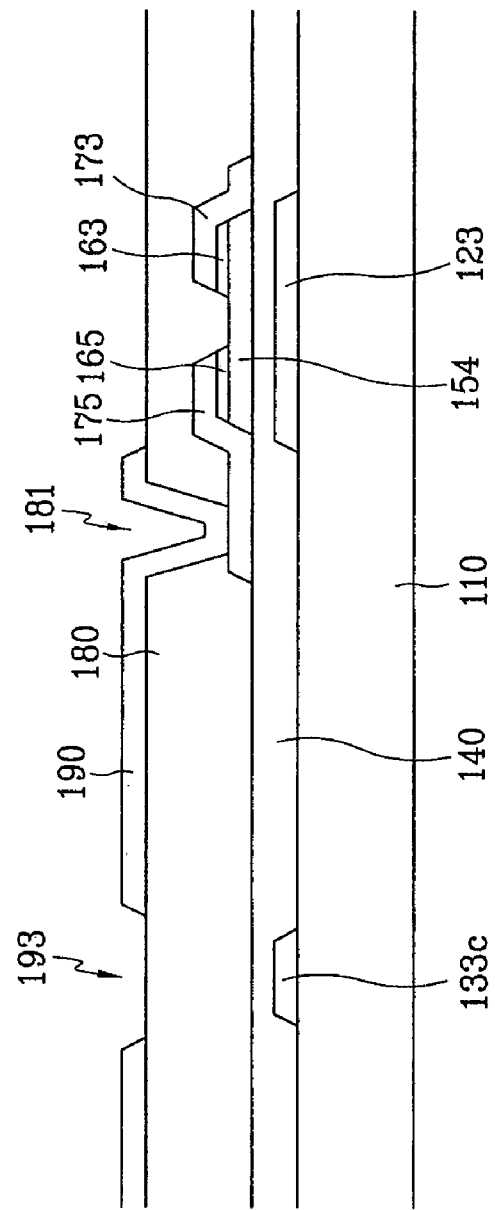
FIGS. 2 and 3 are sectional views of the TFT array panel shown in FIG. 1 taken along the lines II–II' and III–III'.
Figure 3:
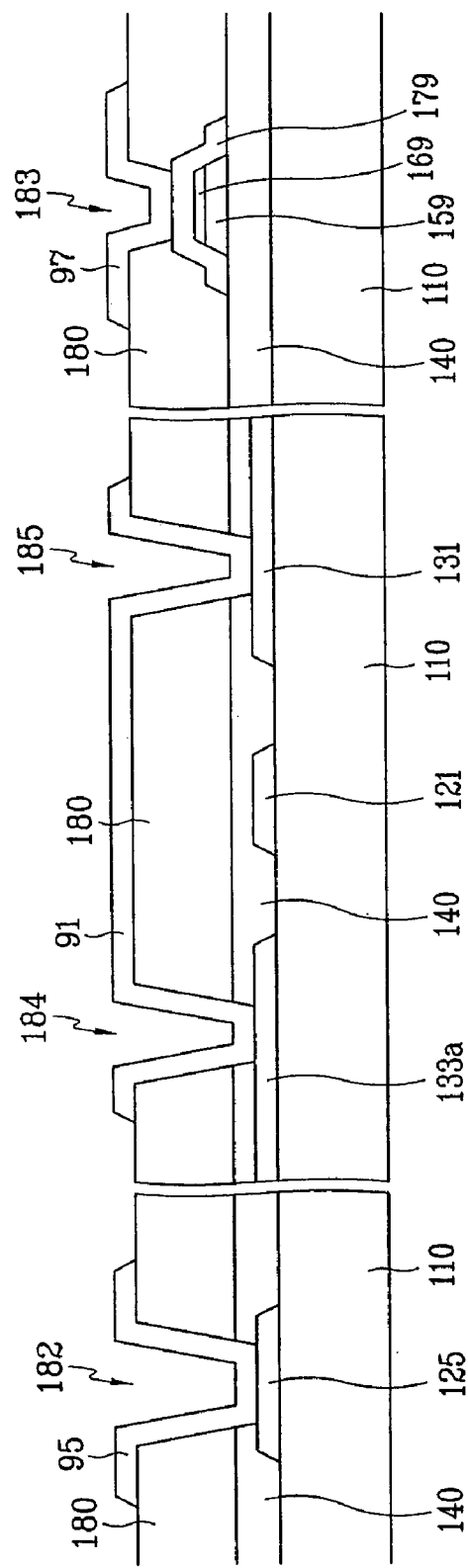

FIG. 1 is a layout view of an exemplary TFT array panel for an LCD according to an embodiment of the present invention, and FIGS. 2 and 3 are sectional views of the TFT array panel shown in FIG. 1 taken along the lines II–II' and III–III'.

A plurality of gate lines 121, a plurality of storage electrode lines 131, and a plurality of storage electrodes 133a–133e are formed on an insulating substrate 110.

The gate lines 121 extend substantially in a transverse direction and transmit gate signals. Each gate line 121 includes a plurality of upward extensions forming a plurality of gate electrodes 123.

The storage electrode lines 131 and the storage electrodes 133a–133e are separated from the gate lines 121 and supplied with a predetermined voltage such as a common voltage, which is applied to a common electrode (not shown) on the other panel (not shown) of the LCD. The storage electrode lines 131 extend substantially in a transverse direction. Each storage electrode 133a–133e includes two longitudinal portions 133a and 133d, two oblique portions 133b and 133c, and a connecting portion 133e. The longitudinal portion 133a is connected to the storage electrode line 131, and the longitudinal portions 133a and 133d are connected by the oblique portions 133b and 133c. In detail, the oblique portion 133b connects a point of the longitudinal portion 133a a little upward the center of the longitudinal portion 133a to an upper end of the longitudinal portion 133d, while the oblique portion 133c connects a point of the longitudinal portion 133a located a little downward the center of the longitudinal portion 133a to a lower end of the longitudinal portion 133d. The longitudinal portions 133a and 133d of adjacent storage electrodes are connected by the connecting portion 133e.

The gate lines 121, the storage electrode lines 131, and the storage electrodes 133a–133e include a low resistivity conductive layer preferably made of Ag containing metal such as Ag and Ag alloy or Al containing metal such as Al and Al alloy. The gate lines 121, the storage electrode lines 131, and the storage electrodes 133a–133e may have a multilayered structure including a low resistivity conductive layer and another layer preferably made of Cr, Ti, Ta, Mo or their alloys such as MoW alloy having good physical, chemical and electrical contact characteristics with other materials such as indium tin oxide (ITO) and indium zinc oxide (IZO). A good exemplary combination of such layers is Cr and Al—Nd alloy.

The lateral sides of the gate lines 121, the storage electrode lines 131, and the storage electrodes 133a–133e are tapered, and the inclination angle of the lateral sides with respect to a surface of the substrate 110 ranges about 30–80 degrees.

A gate insulating layer 140 preferably made of silicon nitride (SiNx) is formed on the gate lines 121, the storage electrode lines 131, and the storage electrodes 133a–133e.

A plurality of semiconductor stripes 151 preferably made of hydrogenated amorphous silicon (abbreviated to "a-Si") are formed on the gate insulating layer 140. Each semiconductor stripe 151 extends substantially in a longitudinal direction and has a plurality of extensions 154 branched out toward the gate electrodes 123.

A plurality of ohmic contact stripes and islands 161 and 165 preferably made of silicide or n+ hydrogenated a-Si heavily doped with n type impurity are formed on the semiconductor stripes 151. Each ohmic contact stripe 161 has a plurality of extensions 163, and the extensions 163 and the ohmic contact islands 165 are located in pairs on the extensions 154 of the semiconductor stripes 151.

The lateral sides of the semiconductor stripes 151 and the ohmic contacts 161 and 165 are tapered, and the inclination angles thereof are preferably in a range between about 30–80 degrees.

A plurality of data lines 171 and a plurality of drain electrodes 175 are formed on the ohmic contacts 161 and 165 and the gate insulating layer 140.

The data lines 171 for transmitting data voltages extend substantially in the longitudinal direction and intersect the gate lines 121. A plurality of branches of each data line 171, which extend toward the drain electrodes 175, form a plurality of source electrodes 173. Each pair of the source electrodes 173 and the drain electrodes 175 are separated from each other and opposite each other with respect to a gate electrode 123. A gate electrode 123, a source electrode 173, and a drain electrode 175 along with an extension 154 of a semiconductor stripe 151 form a TFT having a channel formed in the extension 154 disposed between the source electrode 173 and the drain electrode 175.

The data lines 171 and the drain electrodes 175 include a low resistivity conductive layer preferably made of Ag containing metal or Al containing metal like the gate lines 121, and may have a multilayered structure including a low resistivity conductive layer and another layer preferably made of Cr, Ti, Ta, Mo or their alloys such as MoW alloy having good physical, chemical and electrical contact characteristics with other materials.

The data lines 171 and the drain electrodes 175 have tapered lateral sides and the inclination angles thereof range about 30–80 degrees.

The ohmic contacts 161 and 165 interposed only between the underlying semiconductor stripes 151 and the overlying data lines 171 and the overlying drain electrodes 175 thereon and reduce the contact resistance therebetween. The semiconductor stripes 151 include a plurality of exposed portions, which are not covered with the data lines 171 and the drain electrodes 175, such as portions located between the source electrodes 173 and the drain electrodes 175.

A passivation layer 180 is formed on the data lines 171, the drain electrodes 175, and the exposed portions of the semiconductor stripes 151. The passivation layer 180 is preferably made of photosensitive organic material having a good flatness characteristic, low dielectric insulating material such as a-Si:C:O and a-Si:O:F formed by plasma enhanced chemical vapor deposition (PECVD), or inorganic material such as silicon nitride.

The passivation layer 180 has a plurality of contact holes 181 and 183 exposing the drain electrodes 175 and the end portions 179 of the data lines 171, respectively. The passivation layer 180 and the gate insulating layer 140 has a plurality of contact holes 182, 184 and 185 exposing end portions 125 of the gate lines 121, the storage electrode lines 131, and the longitudinal portions 133a of the storage electrodes, respectively. The contact holes 181–185 can have various shapes such as polygon or circle. The area of each contact hole 181 or 182 is preferably equal to or larger than 0.5 µm×15 µm and not larger than 2 µm×60 µm.

A plurality of pixel electrodes 190, a plurality of contact assistants 95 and 97, and a plurality of connection bridges 91 are formed on the passivation layer 180. The pixel electrodes 190, the contact assistants 95 and 97, and the connection bridges 91 are preferably made of transparent conductive material such as IZO and ITO or reflective metal such as Al.

The pixel electrodes 190 are physically and electrically connected to the drain electrodes 175 through the contact holes 181 and receive the data voltages from the drain electrodes 175. The pixel electrodes 190 supplied with the data voltages generate electric fields in cooperation with the common electrode on the other panel, which reorient liquid crystal molecules disposed therebetween.

A pixel electrode 190 and a common electrode form a capacitor called a "liquid crystal capacitor," which stores applied voltages after turn-off of the TFT. An additional capacitor called a "storage capacitor," which is connected in parallel to the liquid crystal capacitor, is provided for enhancing the voltage storing capacity. The storage capacitors are implemented by overlapping the pixel electrodes 190 with the storage electrode lines 131 and the storage electrodes 133a–133e.

Each pixel electrode 190 has a plurality of cutouts 191–193 for generating fringe fields for controlling tilt directions of the liquid crystal molecules. The plurality of cutouts 191–193 include a transverse cutout 192 bisecting the pixel electrode 190 into upper and lower halves and two oblique cutouts 191 and 193 located the upper and the lower halves of the pixel electrode 190, respectively. The oblique cutouts 191 and 193 make an angle of about 90 degrees such that the molecular tilt directions are uniformly distributed in four directions. The cutouts 191–193 of adjacent pixel electrodes 190 may have inversion symmetry with respect to a data line 171 located therebetween. The oblique portions 133b and 133c of the storage electrodes 133a–133e extend along the oblique cutouts 191 and 193 such that they prevent light leakage near the cutouts 191 and 193.

Each connection bridge 91 transverses a gate line 121 and contacts a storage electrode line 131 and a longitudinal portion 133a of a storage electrode 133a–133d located across the gate line 121 through respective contact holes 184 and 185 to connect them. The connection bridges 91 electrically connect all the storage electrode lines 131 and the storage electrodes 133a–133e.

The storage electrode lines 131 and the storage electrodes 133a–133e can be used for repairing defects of the gate lines 121 and the data lines 171.

The contact assistants 95 and 97 are connected to the exposed end portions 125 of the gate lines 121 and the exposed end portions 179 of the data lines 171 through the contact holes 182 and 183, respectively. The contact assistants 95 and 97 are not requisites but preferred to protect the exposed portions 125 and 179 and to complement the adhesiveness of the exposed portion 125 and 179 and external devices. In particular, the contact holes 182 and the contact assistants 95 can be omitted when gate driving circuits for supplying the gate signals to the gate lines 121 are incorporated into the TFT array panel.

The above-described TFT array panel is one of two panels of an LCD, and a liquid crystal layer containing a plurality of liquid crystal molecules, which may be vertically aligned, are inserted into a gap between the two panels.

The other panel of the LCD will be described in detail.

A black matrix (not shown) having a plurality of openings facing the pixel electrodes 190, a plurality of red, greed and blue color filters (not shown), and a common electrode (not shown) having a plurality of cutouts are formed on an insulating substrate (not shown). The black matrix may cover the cutouts of the common electrode for blocking the light leakage near the cutouts.

The cutouts 191–193 of the pixel electrode 190 and the cutouts of the common electrode partitions each pixel region, which is defined by a portion of the liquid crystal layer interposed between a pixel electrode and an opening of the black matrix facing the pixel electrode 190, into a plurality of domains. The domains are classified into four types based on the directions of average long axes of the liquid crystal molecules contained therein.

Now, the configurations of storage electrode lines and storage electrodes are described in detail.

Figure 4:
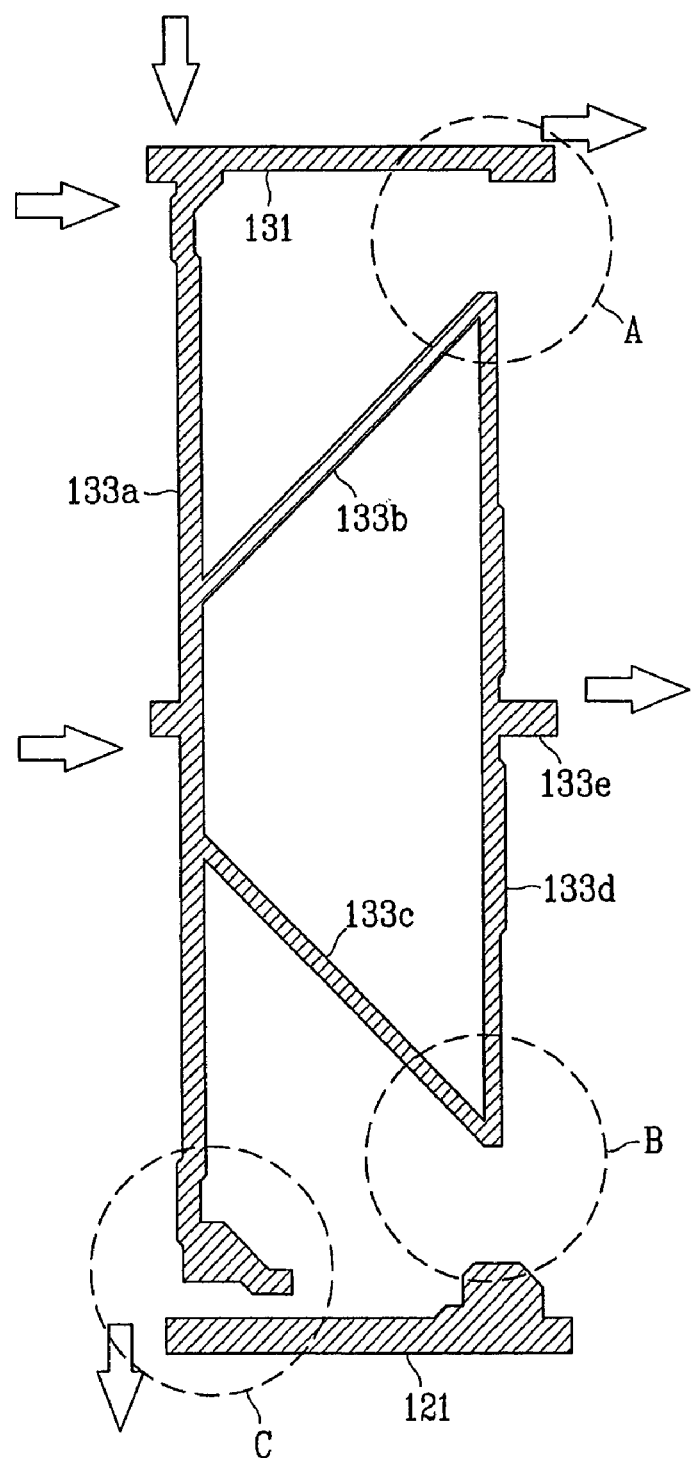
FIG. 4 is a layout view showing the storage electrodes lines 131 and the storage electrodes 133a–133e shown in FIG. 1.

FIG. 4 is a layout view showing the storage electrodes lines 131 and the storage electrodes 133a–133e shown in FIG. 1.

As shown in FIG. 4, a storage electrode line 131 and a plurality of portions 133a–133e of a storage electrode are connected to each other end by end except for a lower end of the longitudinal portion 133a. In other words, there is no "open end" or "isolated end," which is defined as an end having no connection, except for the lower end of the longitudinal portion 133a as indicated by reference character C. As indicated by reference characters A and B, the longitudinal portion 133d and the oblique portions 133b and 133c form a closed loop such that they have no protrusion. In fact, since the lower end of the longitudinal portion 133a is electrically connected to an adjacent storage electrode line 121, there is no place where the electrical charges gather.

FIGS. 5–12 are layout views of storage electrode lines and storage electrodes of TFT array panels according to several embodiments of the present invention.

Figure 5:
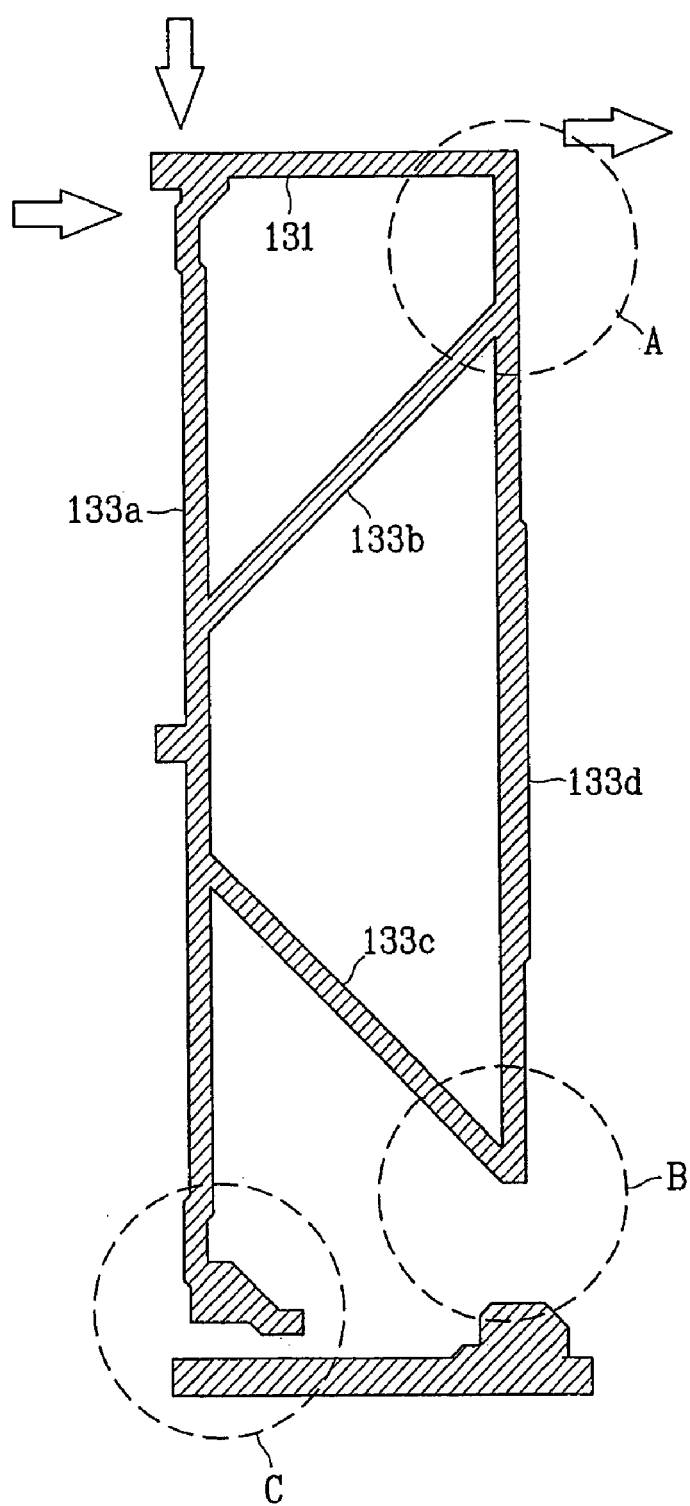
FIGS. 5–12 are layout views of storage electrode lines and storage electrodes of TFT array panels according to several embodiments of the present invention.

FIG. 5 shows a configuration that a longitudinal portion 133d of a storage electrode 133a–133e shown in FIG. 4 extends to be connected to an adjacent storage electrode line 131 such that the storage electrode line 131 and the storage electrode 133a–133d form two closed loops.

Figure 6:
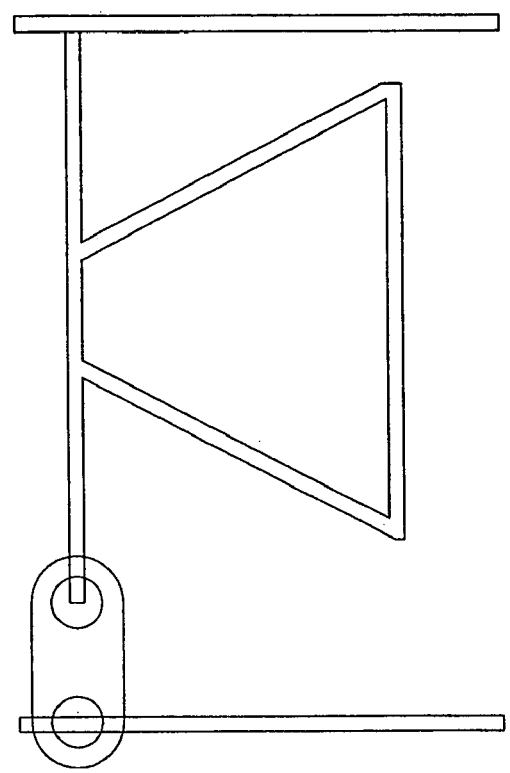
Figure 7:
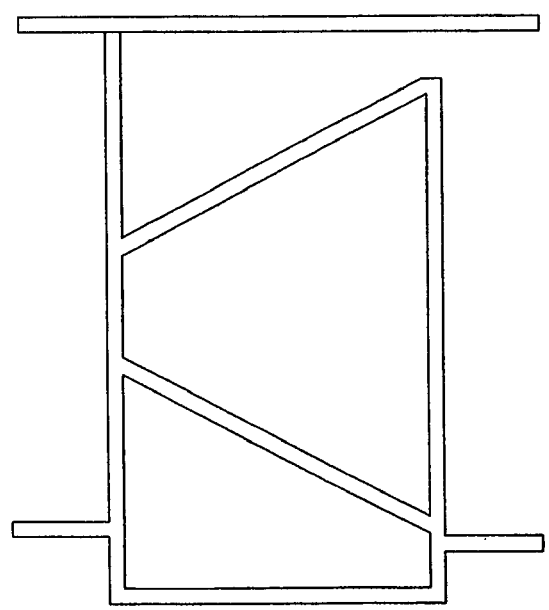
Figure 8:
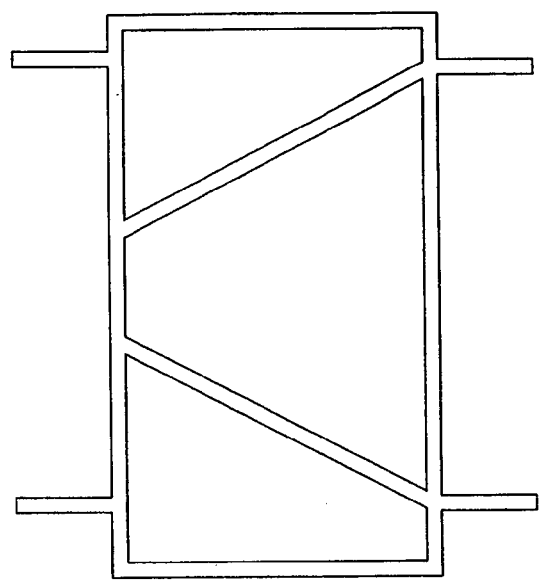
Figure 9:
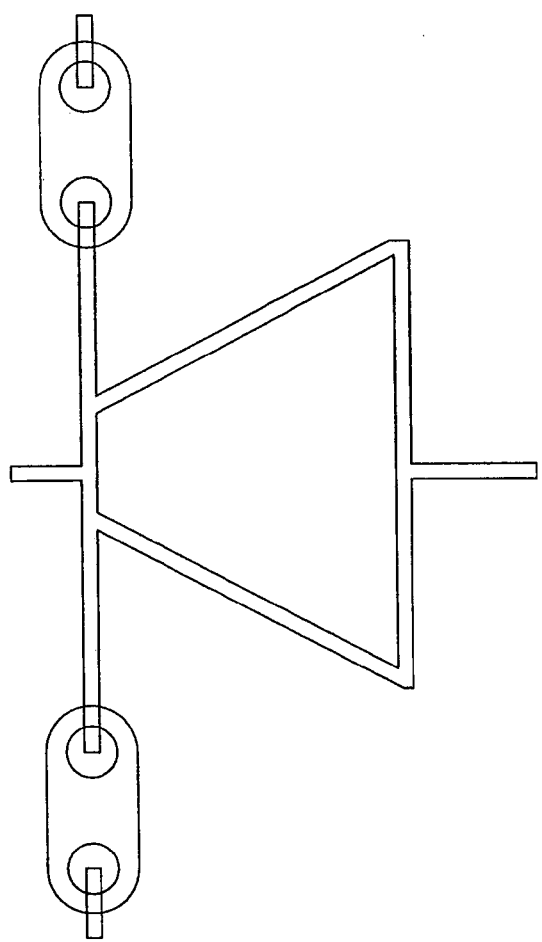
Figure 10:
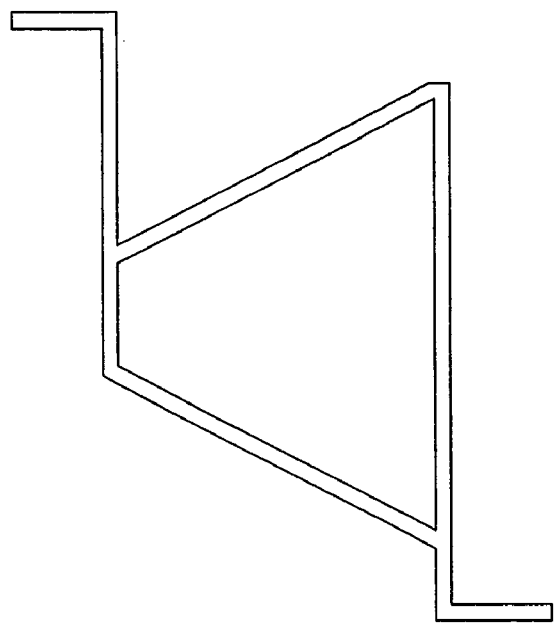
Figure 11:
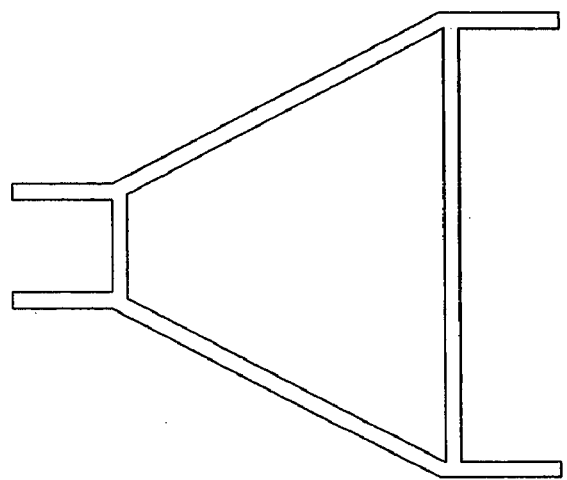
Figure 12:
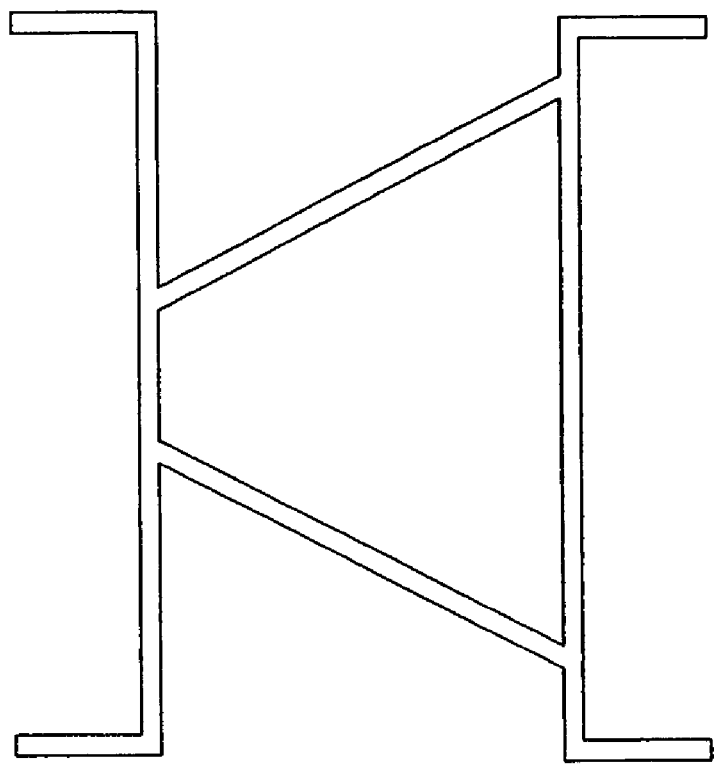

FIG. 6 shows a configuration that there is no connecting portion 133e shown in FIG. 4 and the storage electrode line 131 and the storage electrode 133a–133d form a closed loop. Although the removal of the connecting portion 133e connecting adjacent storage electrodes 133a–133e reduces the number of paths for electrical charges, the connection bridges provide sufficient charge paths. Accordingly, spots and transverse line defects due to charge trapping are reduced.

FIGS. 7–12 show various configurations of storage electrodes, which include no protrusions having an isolated end and include one to three closed loops.

A method of manufacturing the TFT array panel shown in FIGS. 1–3 according to an embodiment of the present invention will be now described in detail with reference to FIGS. 13 to 20B as well as FIGS. 1–3.

FIGS. 13, 15, 17 and 19 are layout views of the TFT array panel shown in FIGS. 1–3 in intermediate steps of a manufacturing method thereof according to an embodiment of the present invention, which sequentially show the manufacturing method. FIGS. 14A and 14B, FIGS. 16A and 16B, FIGS. 18A and 18B, and FIGS. 20A and 20B are sectional views of the TFT array panels shown in FIGS. 13, 15, 17 and 19 taken along the lines XIVA–XIVA' and XIVB–IVB', the lines XVIA–XVIA' and XVIB–XVIB', the lines XVIIIA–XVIIIA' and XVIIIB–XVIIIB', and the lines XXA–XXA' and XXB–XXB', respectively.

Figure 13:
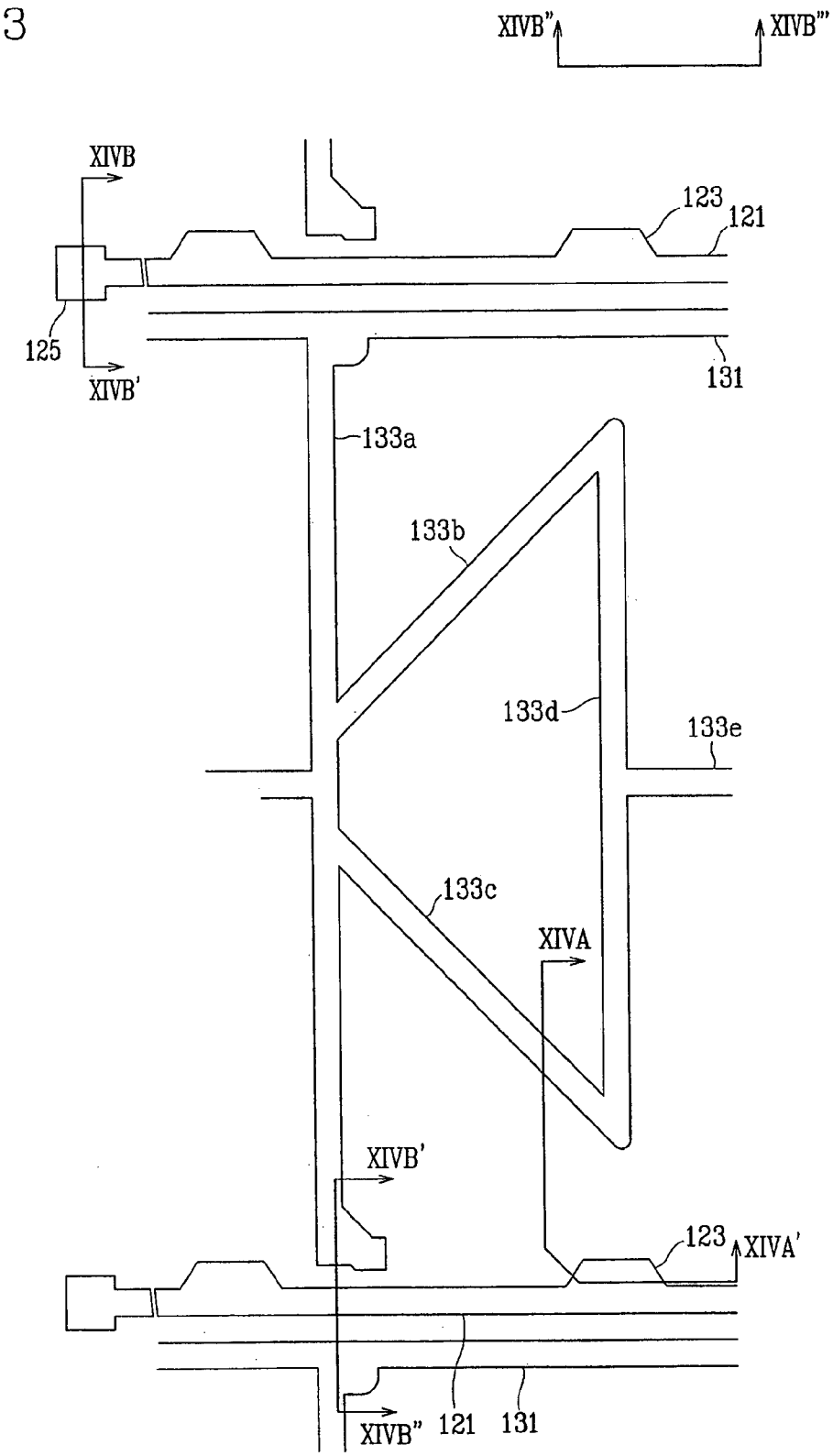
FIGS. 13, 15, 17 and 19 are layout views of the TFT array panel shown in FIGS. 1–3 in intermediate steps of a manufacturing method thereof according to an embodiment of the present invention, which sequentially show the manufacturing method.
Figure 14A:
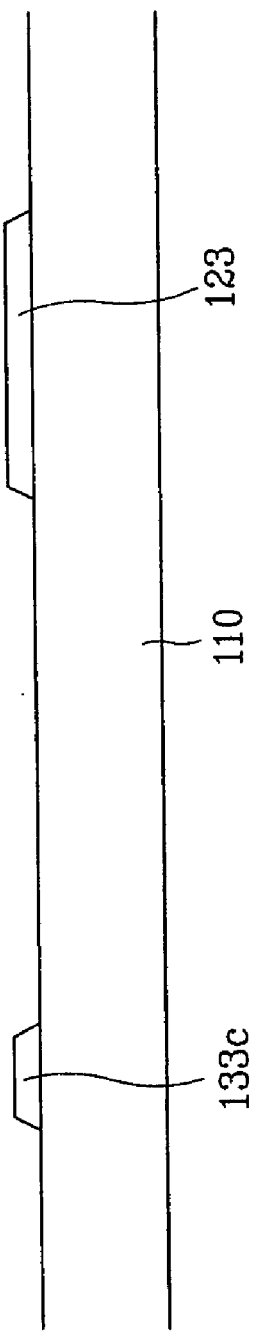
Figure 14B:
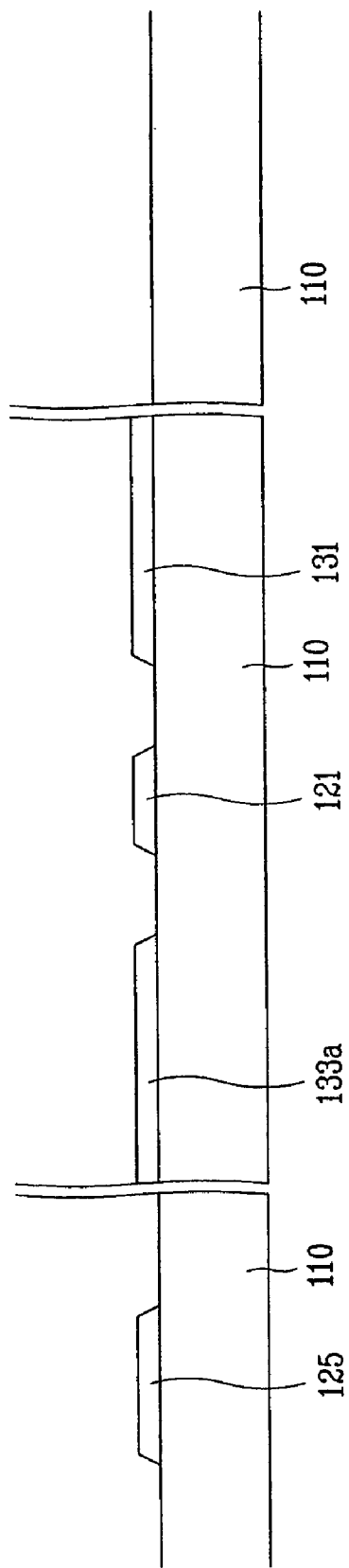

Referring to FIGS. 13 to 14B, a plurality of gate lines 121 including a plurality of gate electrodes 123, a plurality of storage electrode lines 131, and a plurality of storage electrodes 133a–133e are formed by photo etching on an insulating substrate 110 such as transparent glass.

For a double-layered structure, a lower layer (not shown) preferably made of Cr or Mo alloy with good physical and chemical characteristics is first deposited and an upper layer (not shown) preferably made of Ag or Al alloy with low resistivity is deposited. Subsequently, the two layers are photo-etched.

When the lower layer is made of Mo alloy and the upper layer is made of Ag alloy, the two layers can be simultaneously etched by using a Ag etchant containing phosphoric acid, nitric acid, acetic acid and deionized water. Since the etch ratio of the etchant for Ag alloy is larger than that for Mo alloy, an inclination angle of about 30 degrees are obtained.

Figure 15:
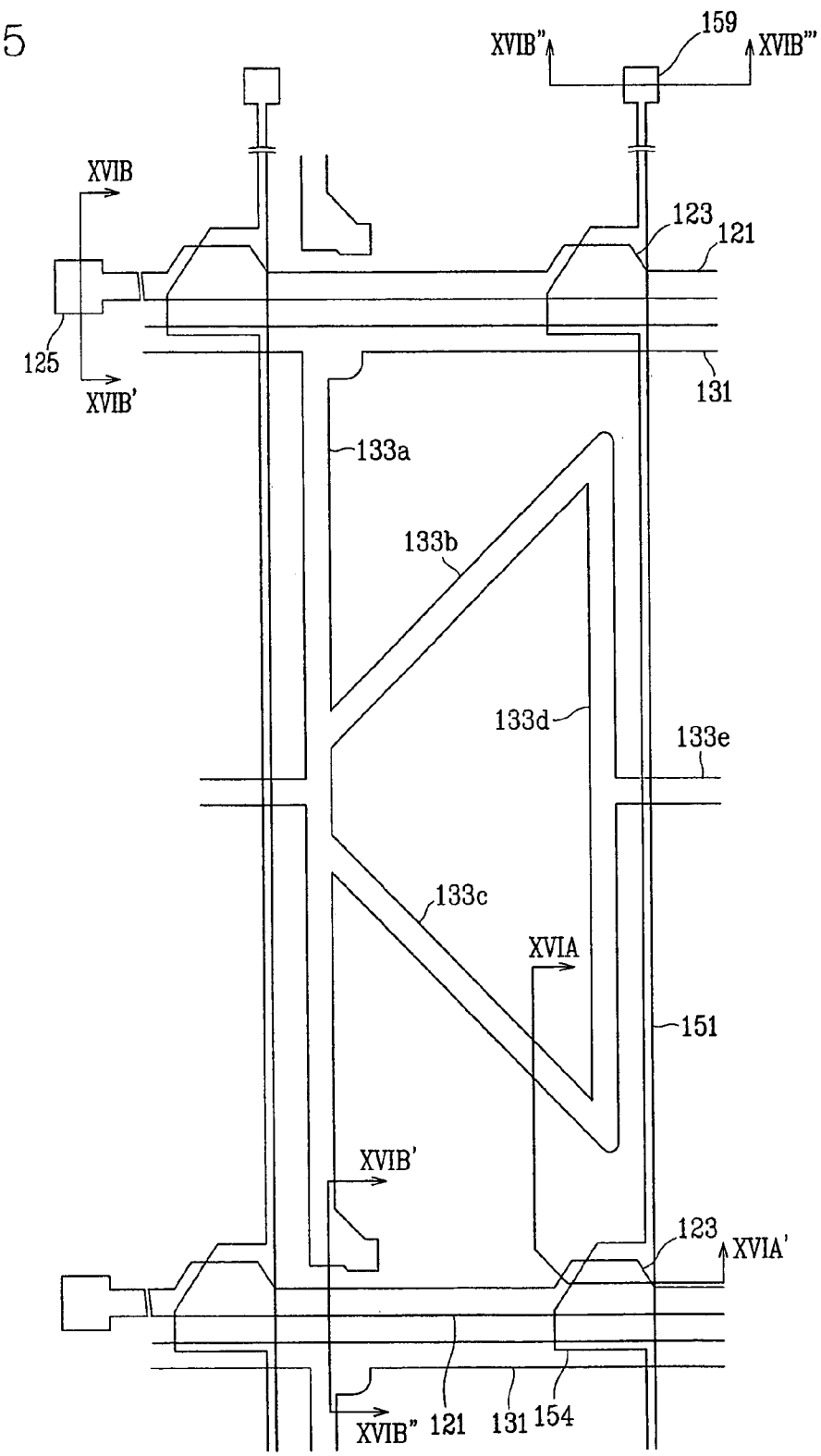
Figure 16A:
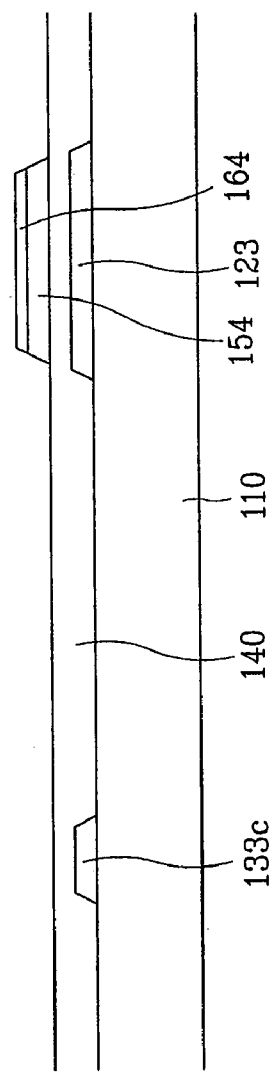
Figure 16B:
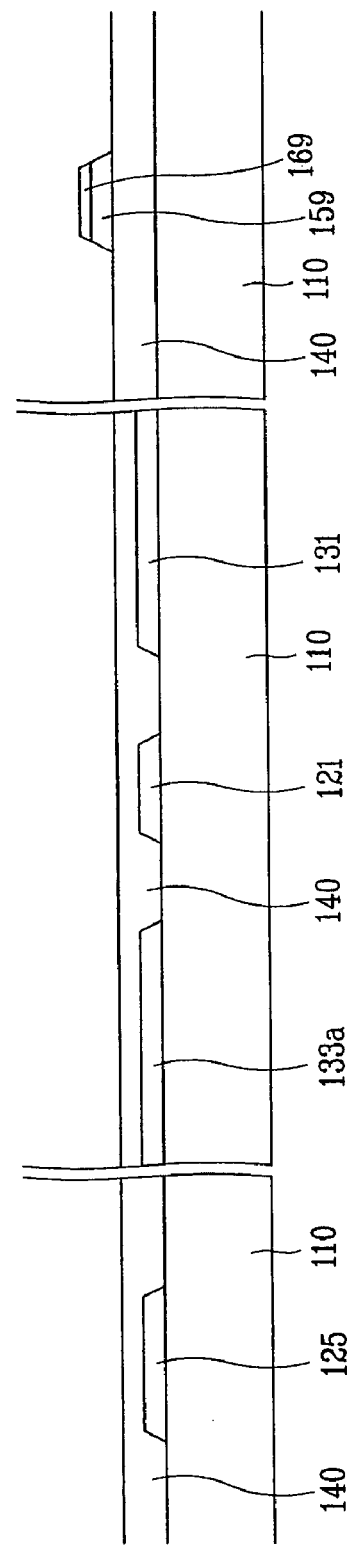

Referring to FIGS. 15 to 16B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 164 and a plurality of intrinsic semiconductor stripes 151 including a plurality of extensions 154 on the gate insulating layer 140. The gate insulating layer 140 is preferably made of silicon nitride with thickness of about 2,000 Å to about 5,000 Å, and the deposition temperature is preferably in a range between about 250° C. and about 500° C.

Figure 17:
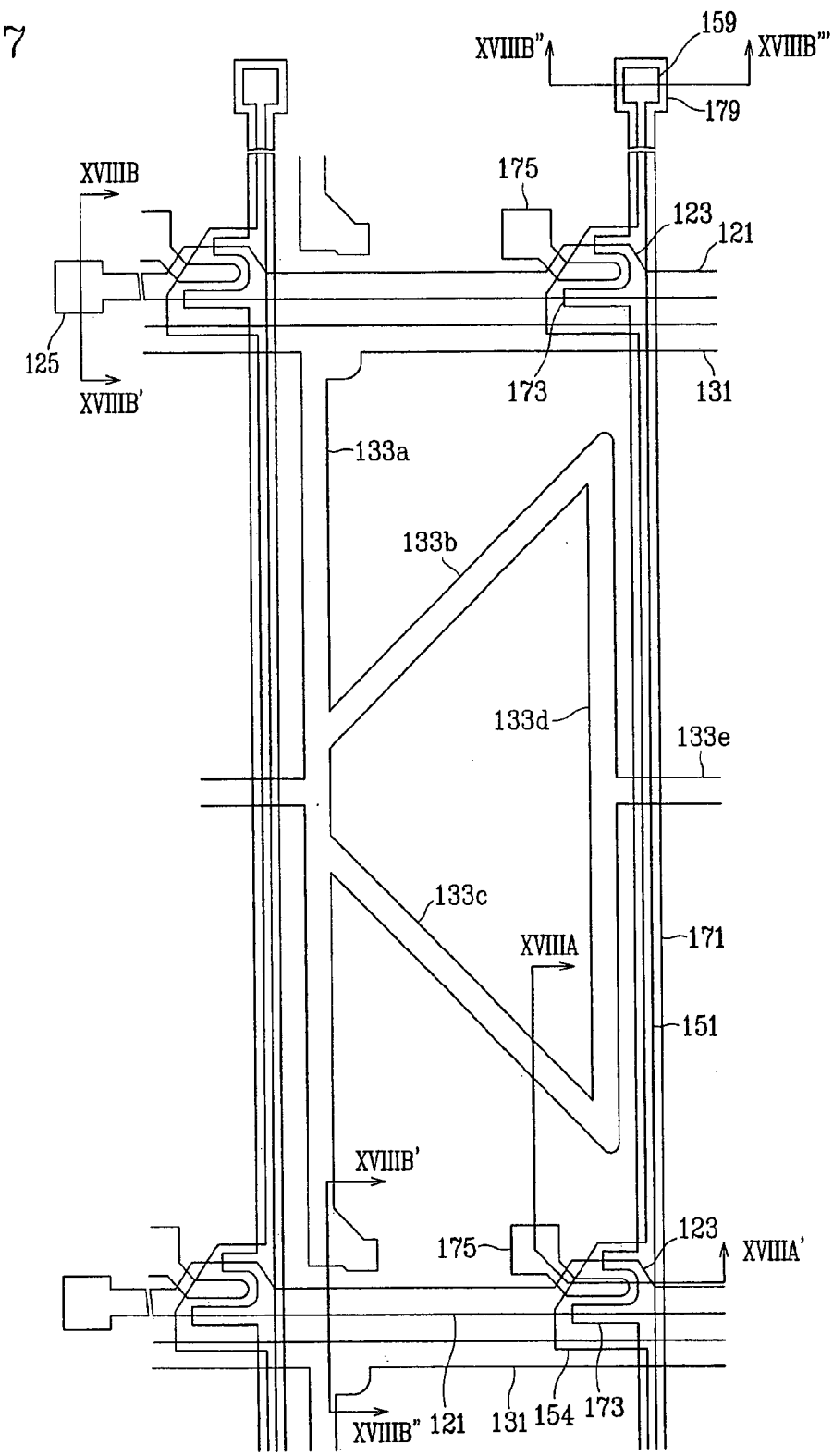
Figure 18A:
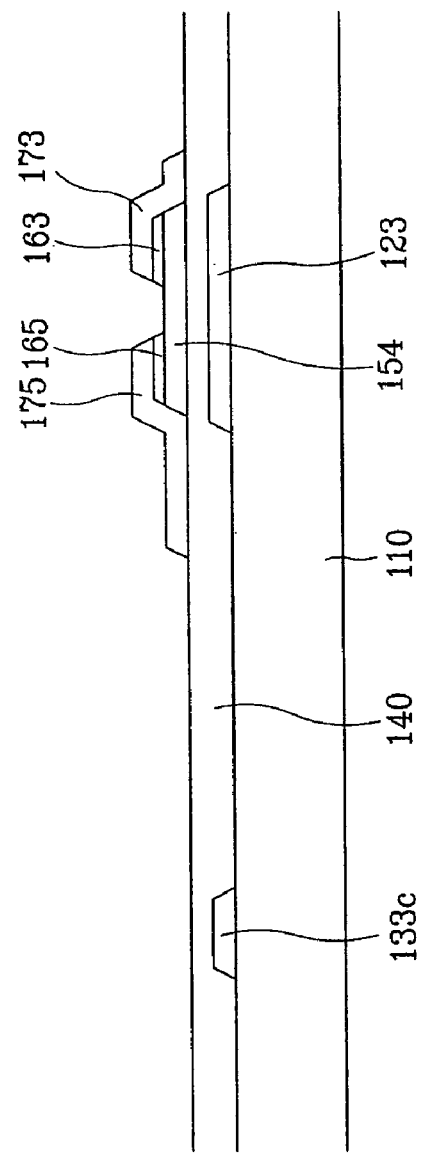
Figure 18B:
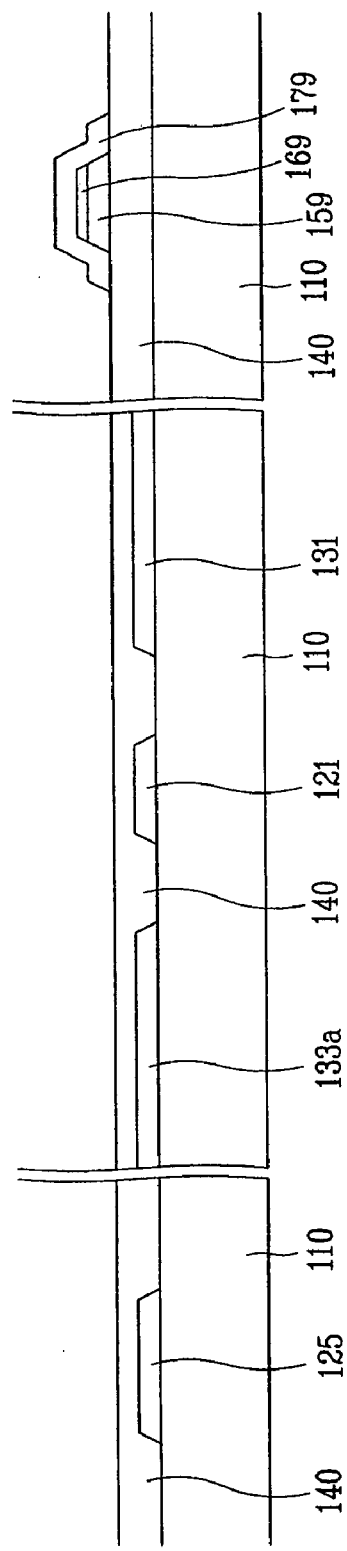

Referring to FIGS. 17 to 18B, a plurality of data lines 171 including a plurality of source electrodes 173 and a plurality of drain electrodes 175 are formed by photo etching.

Subsequently, portions of the extrinsic semiconductor stripes 164, which are not covered with the data lines 171 and the drain electrodes 175 are removed to complete a plurality of ohmic contact stripes 161 including a plurality of extensions 163 and a plurality of ohmic contact islands 165 and to expose portions of the intrinsic semiconductor stripes 151. Oxygen plasma treatment preferably follows thereafter in order to stabilize the exposed surfaces of the semiconductor stripes 151.

Figure 19:
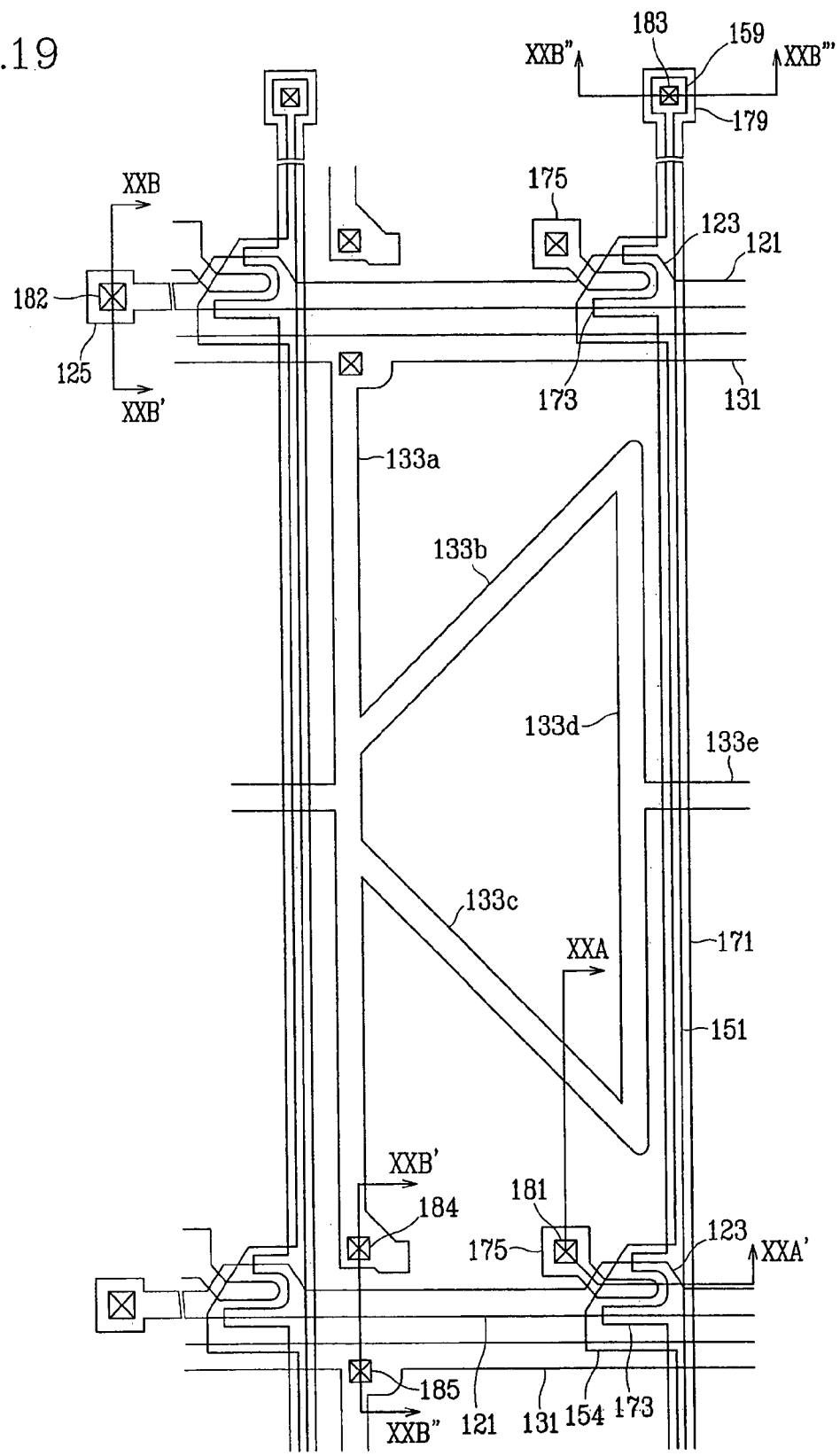

Referring to FIGS. 19 to 20B, a passivation layer 180 is formed by growing a-Si:C:O or a-Si:O:F, by CVD of inorganic material such as silicon nitride, or by coating an organic insulating material such as acryl-based material. When forming an a-Si:C:O layer, $SiH(CH_3)_3$, $SiO_2(CH_3)_4$, $(SiH)_4O_4(CH_3)_4$, $Si(C_2H_5O)_4$ or the like used as basic source, oxidant such as $N_2O$ or $O_2$, and Ar or He are mixed in gaseous states to flow for the deposition. For an s-Si:O:F layer, the deposition is performed by flowing a gas mixture including $SiH_4$, $SiF_4$ or the like and an additional gas of $O_2$. $CF_4$ may be added as a secondary source of fluorine.

Subsequently, the passivation layer 180 together with the gate insulating layer 140 is photo-etched to form a plurality of contact holes 181, 182 and 183 exposing the drain electrodes 175, end portions 125 of the gate lines 121, and end portions 179 of the data lines 179, and a plurality of contact holes 184 and 185 exposing the storage electrodes lines 131 and the storage electrodes 133a–133e.

Finally, as shown in FIGS. 1–3, a plurality of pixel electrodes 190, a plurality of contact assistants 95 and 97, and a plurality of connection bridges 91 are formed on the passivation layer 180 by sputtering and photo-etching an IZO layer or an ITO layer.

An example of sputtering target for the IZO layer is IDIXO (indium x-metal oxide) produced by Idemitsu Co. of Japan. The sputtering target includes $In_2O_3$ and ZnO, and the ratio of Zn with respect to the sum of Zn and In is preferably in a range of about 15–20 atomic %. The preferred sputtering temperature for minimizing the contact resistance is equal to or lower than about 250° C. The etching of the IZO or ITO layer preferably includes wet etching using a Cr etchant of $HNO_3/(NH_4)_2Ce(NO_3)_6/H_2O$, which does not erode Al of the data lines 171, the drain electrodes 175, the gate lines 121, the storage electrode lines 131, and the storage electrodes 133a–133e. Nitrogen gas, which prevents the formation of metal oxides on the exposed portions of the drain electrodes 175, the gate lines 121, the data lines 171, the storage electrode lines 131, and the storage electrodes 133a–133e through the contact holes 181–185, is preferably used for the pre-heating process before the deposition of the ITO layer or the IZO layer.

A TFT array panel for an LCD according to another embodiment of the present invention will be described in detail with reference to FIGS. 21 and 22B.

Figure 21:
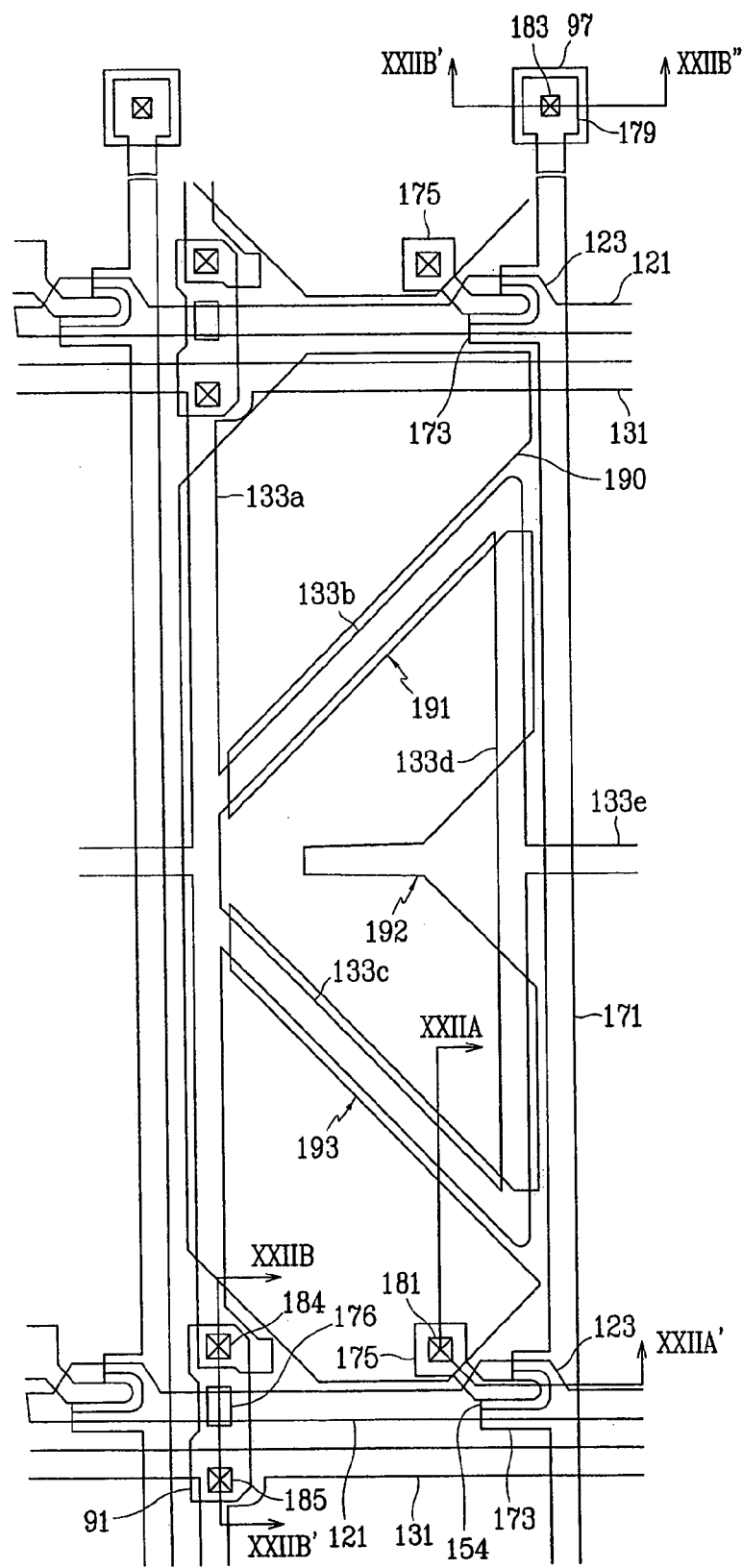
FIG. 21 is a layout view of an exemplary TFT array panel for an LCD according to another embodiment of the present invention.
Figure 22A:
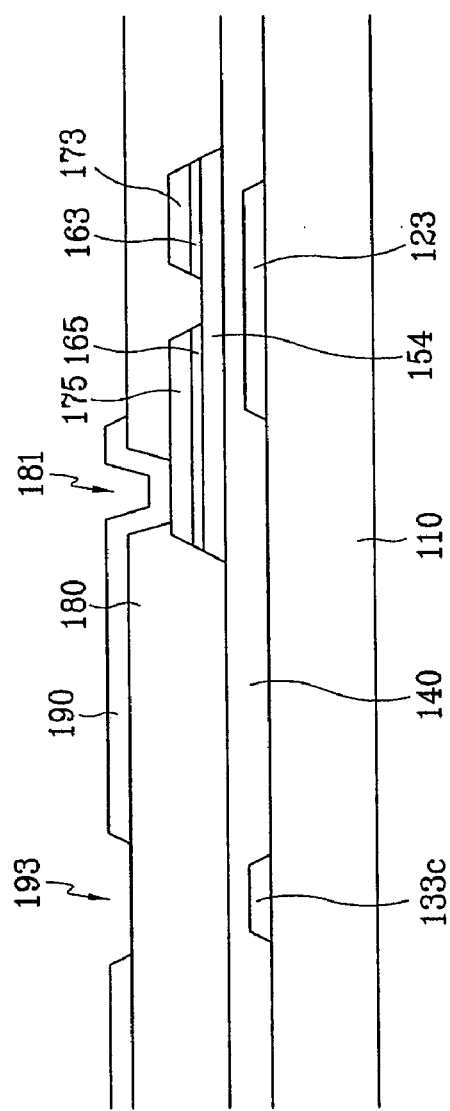
FIGS. 22A and 22B are sectional views of the TFT array panel shown in FIG. 21 taken along the lines XXIIA–XXIIA' and XXIIB–XXIIB'.
Figure 22B:
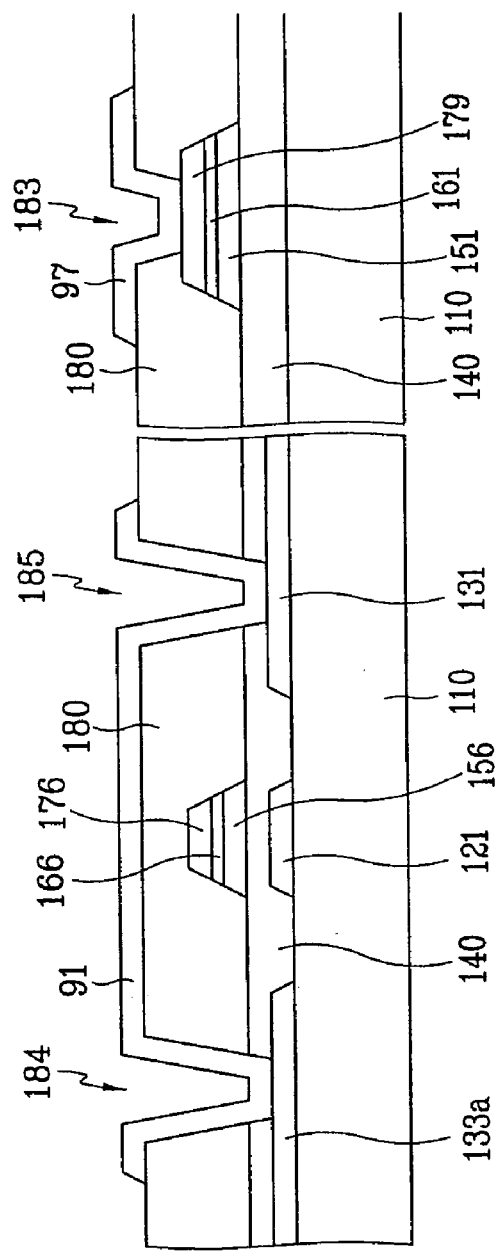

FIG. 21 is a layout view of an exemplary TFT array panel for an LCD according to another embodiment of the present invention, and FIGS. 22A and 22B are sectional views of the TFT array panel shown in FIG. 21 taken along the lines XXIIA–XXIIA' and XXIIB–XXIIB'.

As shown in FIGS. 21 to 22B, a layered structure of a TFT array panel of an LCD according to this embodiment is almost the same as that shown in FIGS. 1–3. That is, a plurality of gate lines 121 including a plurality of gate electrodes 123, a plurality of storage electrode lines 131, and the storage electrodes 133a–133e are formed on a substrate 110, and a gate insulating layer 140, a plurality of semiconductor stripes 151 including a plurality of extensions 154, and a plurality of ohmic contact stripes 161 including a plurality of extensions 163 and a plurality of ohmic contact islands 165 are sequentially formed thereon. A plurality of data lines 171 including a plurality of source electrodes 173 and a plurality of drain electrodes 175 are formed on the ohmic contacts 161 and 165, and a passivation layer 180 is formed thereon. A plurality of contact holes 181–185 are provided at the passivation layer 180 and/or the gate insulating layer 140, and a plurality of pixel electrodes 190, a plurality of contact assistants 95 and 97, and a plurality of connection bridges 91 are formed on the passivation layer 180.

Different from the TFT array panel shown in FIGS. 1–3, the TFT array panel according to this embodiment provides a plurality of under-bridge metal pieces 176 located between the gate lines 121 and the connection bridges 91. In addition, as well as the semiconductor stripes 151 and the ohmic contacts 161 and 165, a plurality of semiconductor islands 156 and a plurality of ohmic contact islands 166 thereover are provided between the under-bridge metal pieces 176 and the gate insulating layer 140.

The under-bridge metal pieces 176 enhance electrical connection between the gate lines 121 and the connection bridges 91 by laser irradiation for repairing the defects of the gate lines 121 and the data lines 171 using the storage electrode lines 131 and the storage electrodes 133a–133e.

The semiconductor stripes and islands 151 and 156 have almost the same planar shapes as the data lines 171, the drain electrodes 175 and the under-bridge metal pieces 176 as well as the underlying ohmic contacts 161, 165 and 166, except for the extensions 154 where TFTs are provided. In particular, the semiconductor islands 156, the ohmic contact islands 166 and the under-bridge metal pieces 176 have substantially the same planar shape. The semiconductor stripes 151 include some exposed portions, which are not covered with the data lines 171, the drain electrodes 175 and the under-bridge metal pieces 176, such as portions located between the source electrodes 173 and the drain electrodes 175.

Now, a method of manufacturing the TFT array panel shown in FIGS. 21–22B according to an embodiment of the present invention will be described in detail with reference to FIGS. 23–29B as well as FIGS. 21–22B.

Figure 23:
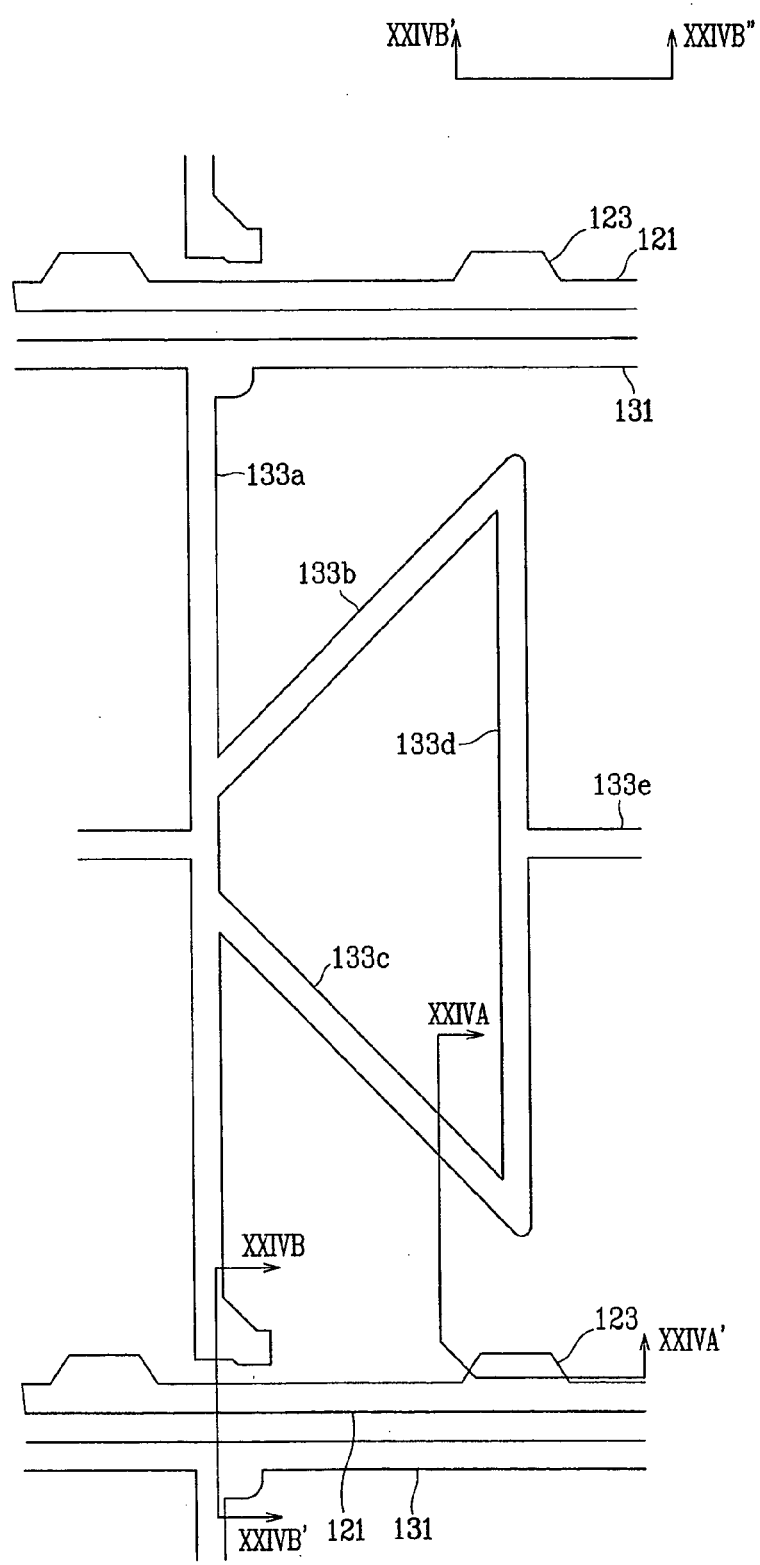
FIGS. 23, 26 and 28 are layout views of the TFT array panel shown in FIGS. 21–22B in intermediate steps of a manufacturing method thereof according to an embodiment of the present invention, which sequentially show the manufacturing method.
Figure 25A:
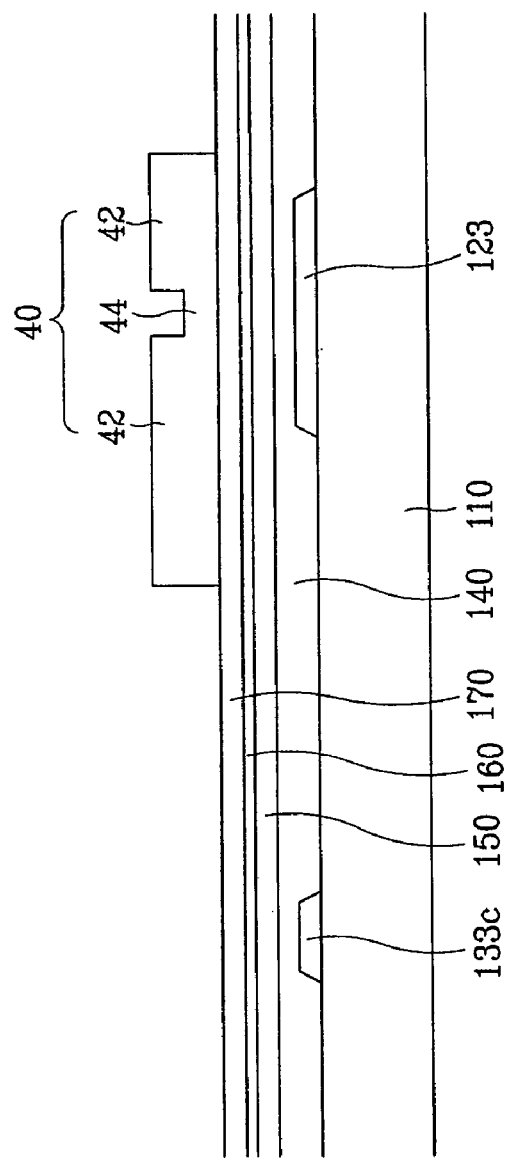
FIGS. 25A and 25B are sectional views of the TFT array panels shown in FIG. 23, which illustrates a step following the step shown in FIGS. 24A and 24B.
Figure 25B:
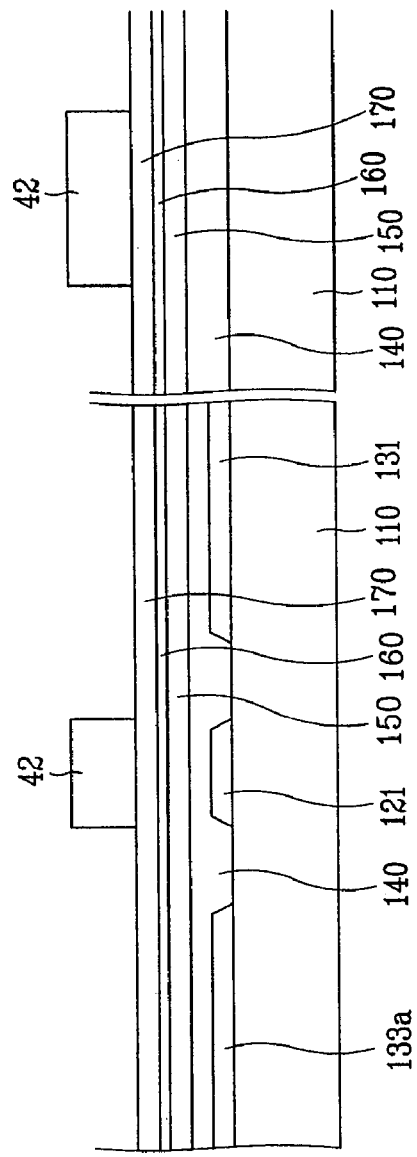
Figure 26:
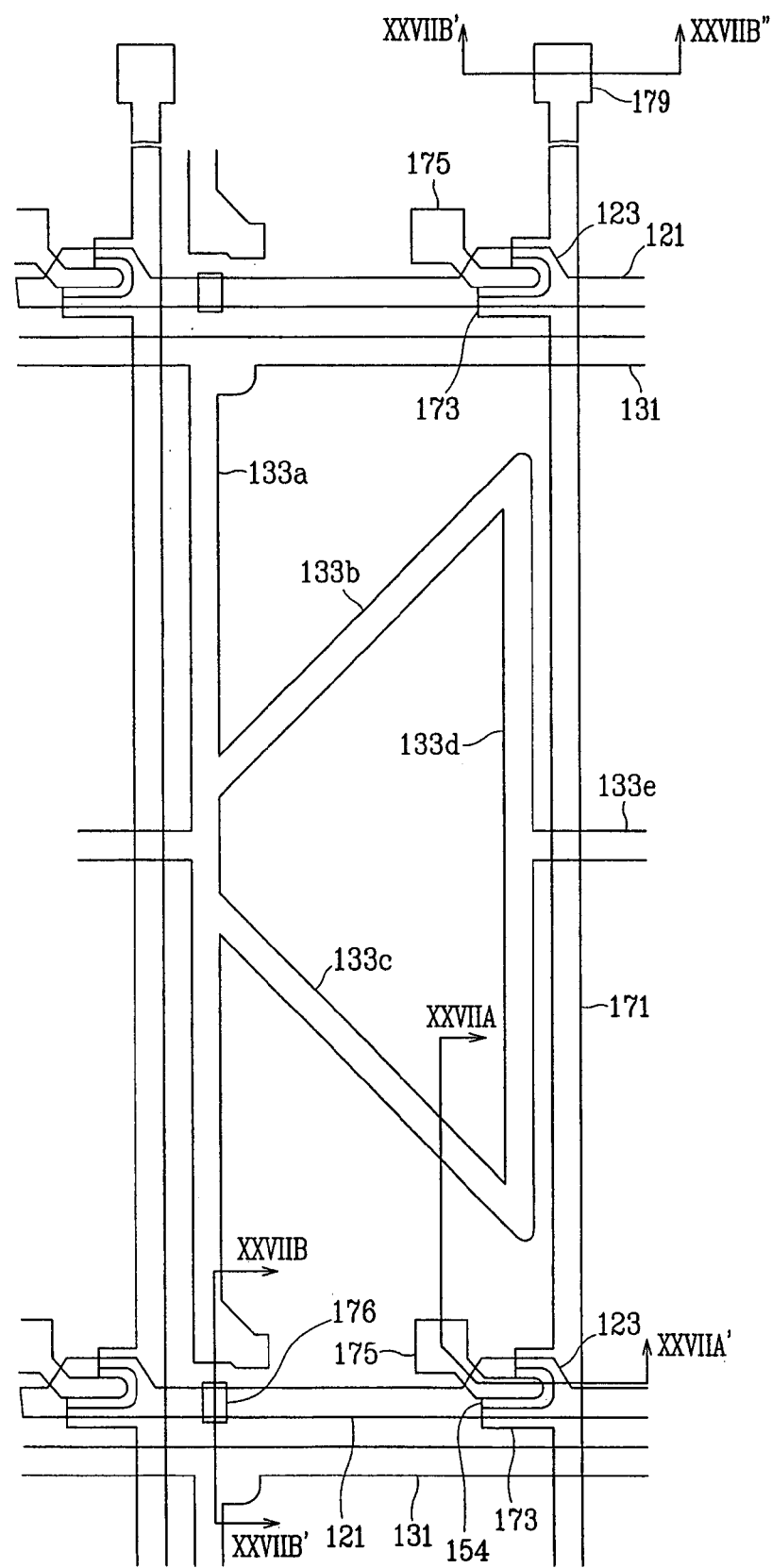
Figure 27A:
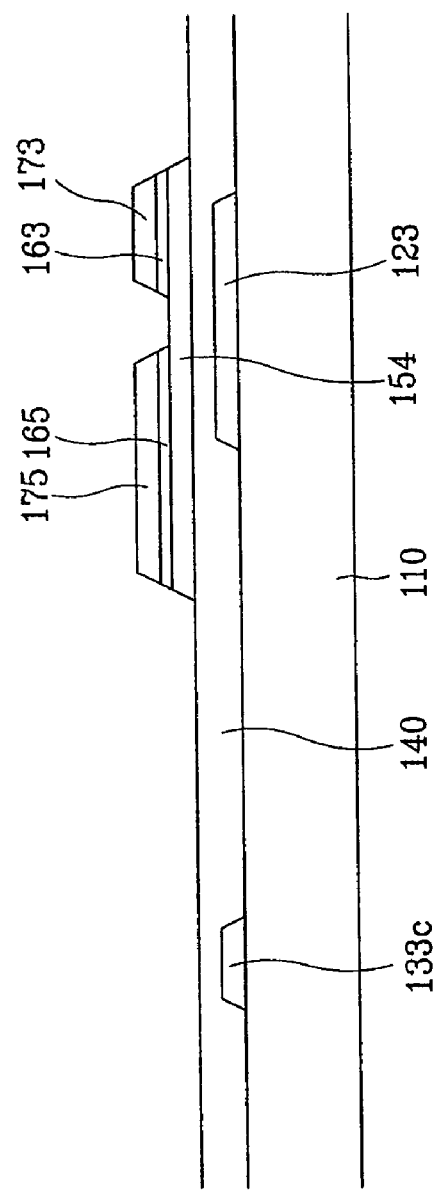
Figure 28:
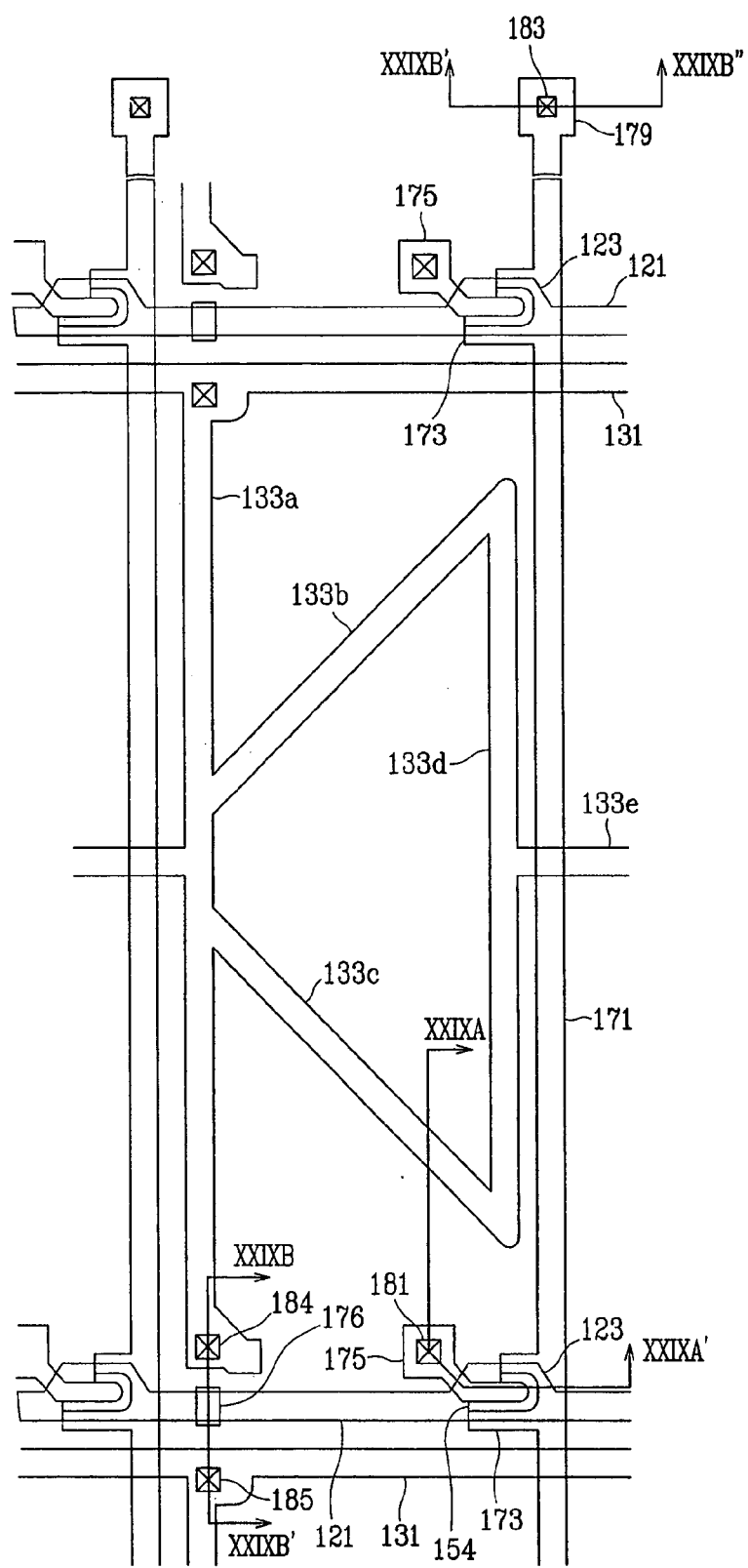

FIGS. 23, 26 and 28 are layout views of the TFT array panel shown in FIGS. 21–22B in intermediate steps of a manufacturing method thereof according to an embodiment of the present invention, which sequentially show the manufacturing method. FIGS. 24A and 24B, FIGS. 27A and 27B, and FIGS. 29A and 29B are sectional views of the TFT array panels shown in FIGS. 23, 26 and 28 taken along the lines XXIVA–XXIVA' and XXIVB–XXIVB', the lines XXVIIA–XXVIIA' and XXVIIB–XXVIIB', and the lines XXIXA–XXIXA' and XXIXB–XXIXB', respectively, and FIGS. 25A and 25B are sectional views of the TFT array panels shown in FIG. 23, which illustrates the step following the step shown in FIGS. 24A and 24B.

Figure 24A:
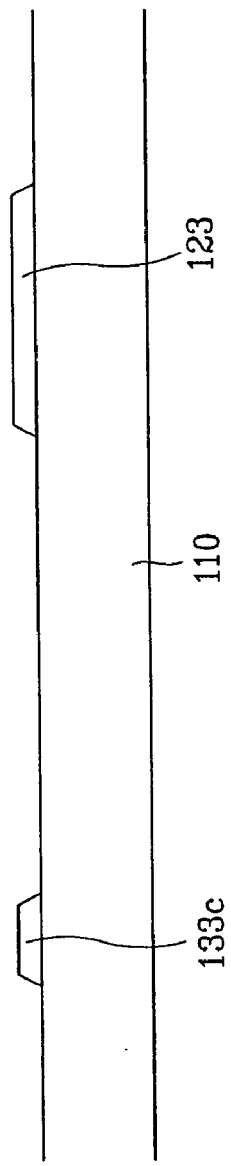
Figure 24B:
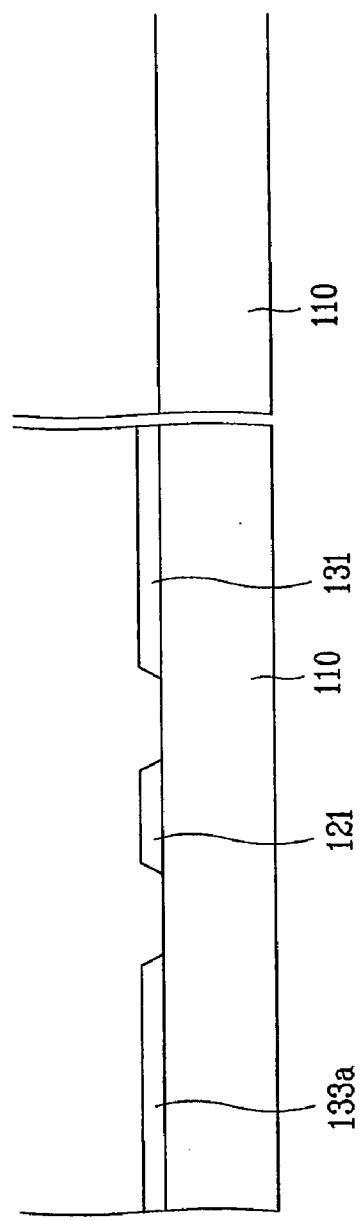

Referring to FIGS. 23–24B, a plurality of gate lines 121 including a plurality of gate electrodes 123, a plurality of storage electrode lines 131, and a plurality of storage electrodes 133a–133e are formed by photo etching on an insulating substrate 110 such as transparent glass.

As shown in FIGS. 25A and 25B, a gate insulating layer 140, an intrinsic a-Si layer 150, and an extrinsic a-Si layer 160 are sequentially deposited by CVD such that the layers 140, 150 and 160 bear thickness of about 1,500–5,000 Å, about 500–2,000 Å and about 300–600 Å, respectively. A conductive layer 170 is deposited by sputtering, and a photoresist film with the thickness of about 1–2 microns is coated on the conductive layer 170.

The photoresist film is exposed to light through an exposure mask (not shown), and developed such that the developed photoresist 40 has a position dependent thickness. The photoresist 40 shown in FIGS. 25A and 25B includes a plurality of first to third portions with decreased thickness. The first portions 42 and the second portions 44 are indicated by reference numerals 42 and 44, respectively, and no reference numeral is assigned to the third portions since they have substantially zero thickness to expose underlying portions of the conductive layer 170. The thickness ratio of the second portions 44 to the first portions 42 is adjusted depending upon the process conditions in the subsequent process steps. It is preferable that the thickness of the second portions 44 is equal to or less than half of the thickness of the first portions 42, and in particular, equal to or less than 4,000 Å.

The position-dependent thickness of the photoresist 40 is obtained by several techniques, for example, by providing translucent areas on the exposure mask as well as transparent areas and light blocking opaque areas. The translucent areas may have a slit pattern, a lattice pattern, a thin film(s) with intermediate transmittance or intermediate thickness. When using a slit pattern, it is preferable that the width of the slits or the distance between the slits is smaller than the resolution of a light exposer used for the photolithography. Another example is to use reflowable photoresist. That is, once a photoresist pattern made of a reflowable material is formed by using a normal exposure mask only with transparent areas and opaque areas, it is subject to reflow process to flow onto areas without the photoresist, thereby forming thin portions.

The different thickness of the photoresist film 40 enables to selectively etch the underlying layers when using suitable process conditions. Therefore, a plurality of data lines 171 including a plurality of source electrodes 173, a plurality of drain electrodes 175, and a plurality of under-bridge metal pieces 176 as well as a plurality of ohmic contact stripes 161 including a plurality of extensions 163, a plurality of ohmic contact islands 165 and 166, a plurality of semiconductor stripes 151 including a plurality of extensions 154, and a plurality of semiconductor islands 156 are obtained by a series of etching steps.

For descriptive purpose, portions of the conductive layer 170, the extrinsic a-Si layer 160, and the intrinsic a-Si layer 150 under the first portions 42 of the photoresist 40 are called first portions, portions of the conductive layer 170, the extrinsic a-Si layer 160, and the intrinsic a-Si layer 150 under the second portions 44 of the photoresist 40 are called second portions, and portions of the conductive layer 170, the extrinsic a-Si layer 160, and the intrinsic a-Si layer 150 on the remaining areas are called third portions.

An exemplary sequence of forming such a structure is as follows:

(1) Removal of third portions of the conductive layer 170, the extrinsic a-Si layer 160 and the intrinsic a-Si layer 150 on the wire areas A;

(2) Removal of the second portions 44 of the photoresist;

(3) Removal of the second portions of the conductive layer 170 and the extrinsic a-Si layer 160 on the channel areas C; and (4) Removal of the first portions 42 of the photoresist.

Another exemplary sequence is as follows:

(1) Removal of the third portions of the conductive layer 170;

(2) Removal of the second portions 44 of the photoresist;

(3) Removal of the third portions of the extrinsic a-Si layer 160 and the intrinsic a-Si layer 150;

(4) Removal of the second portions of the conductive layer 170;

(5) Removal of the first portions 42 of the photoresist; and (5) Removal of the second portions of the extrinsic a-Si layer 160.

Although the removal of the second portion 44 of the photoresist 40 causes the thickness reduction of the first portion 42 of the photoresist 40, it does not remove the first portion 42, which protects the underlying layers from removal or etching, since the thickness of the second portion 44 is smaller than the first portion 42.

By selecting an appropriate etching condition, the second portion 44 of the photoresist 40 and the portions of the doped a-Si layer 160 and the a-Si layer 150 under the third portion of the photoresist 40 are simultaneously removed. Similarly, the removal of the first portion 42 of the photoresist 40 and the removal of the portions of the doped a-Si layer 160 under the second portion 44 of the photoresist 40 are simultaneously performed. For instance, the etched thicknesses of the photoresist 40 and the a-Si layer 150 (or the doped a-Si layer 160) are nearly the same when using a gas mixture of $SF_6$ and HCl, or a gas mixture of $SF_6$ and $O_2$.

Photoresist remnants left on the surface of the conductive layer 170, if any, are removed by ashing.

Examples of etching gases used for etching the doped a-Si layer 160 in the step (3) of the first example and in the step (4) of the second example are a gas mixture of $CF_4$ and HCl and a gas mixture of $CF_4$ and $O_2$. Use of the gas mixture of $CF_4$ and $O_2$ enables to obtain uniform thickness of etched portions of the semiconductor layer 150.

Figure 29A:
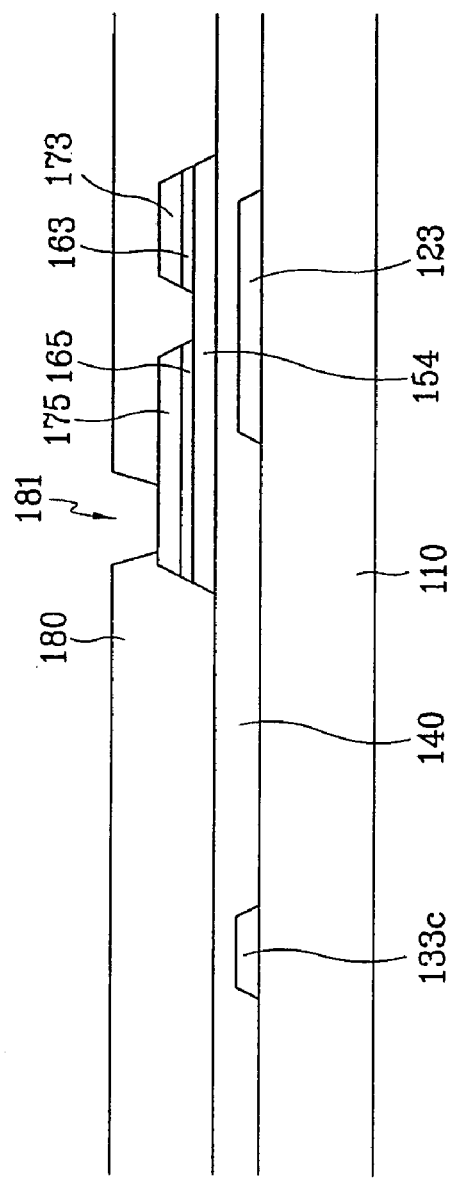
Figure 29B:
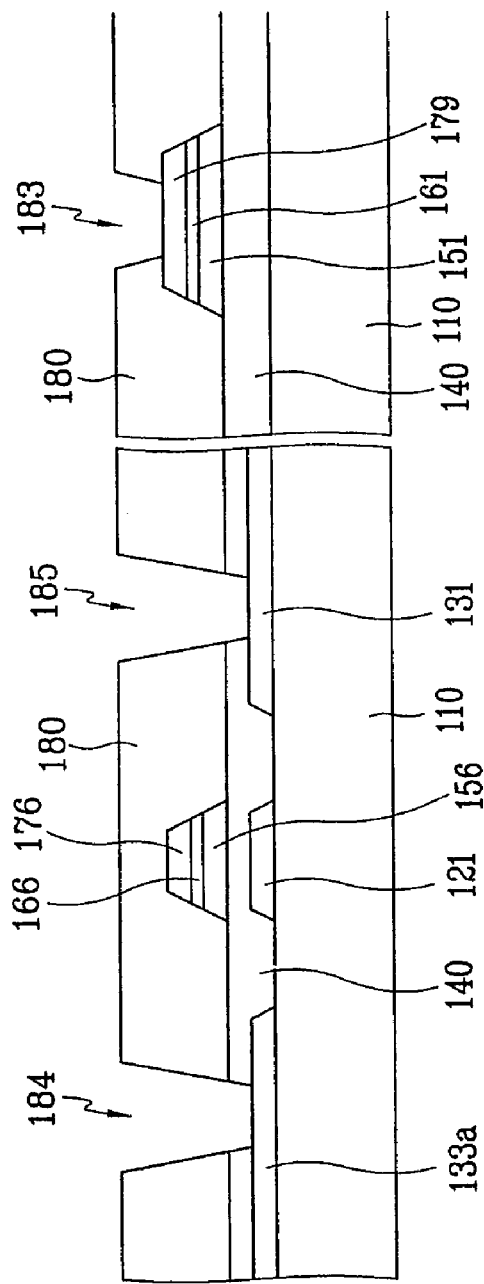

Referring to FIGS. 28–29B, the passivation layer 180 is deposited and photo-etched together with the gate insulating layer 140 to form a plurality of contact holes 181–185 exposing the drain electrodes 175, end portions 125 of the gate lines 121, end portions 179 of the data lines 179, the storage electrodes lines 131 and the storage electrodes 133a–133e.

Finally, as shown in FIGS. 21–22B, a plurality of pixel electrodes 190, a plurality of contact assistants 95 and 97, and a plurality of connection bridges 91 are formed on the passivation layer 180 by sputtering and photo-etching an IZO layer or an ITO layer.

This embodiment simplifies the manufacturing process by forming the data lines 171, the drain electrodes 175, and the under-bridge metal pieces 176 as well as the ohmic contacts 161, 165 and 166 and the semiconductor stripes and islands 151 and 156 using a single photolithography step.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A thin film transistor array panel, comprising:
   an insulating substrate;
   a gate line formed on the substrate;
   a plurality of storage electrodes formed on the substrate, each storage electrode including a plurality of branches, wherein one of the branches has an isolated end and the remaining branches form a closed loop, and wherein the isolated end is electrically connected by a connector to a storage electrode line formed on the substrate;
   a gate insulating layer formed on the gate line and the storage electrode;
   a semiconductor layer formed on the gate insulating layer;
   a data conductor formed on the semiconductor layer;
   a passivation layer formed on the data conductor; and
   a pixel electrode layer formed on the passivation layer.

2. The thin film transistor array panel of claim 1, wherein adjacent storage electrodes are connected by connecting portions.

3. The thin film transistor array panel of claim 1, wherein the connector is a connection bridge having a portion thereof connected to the isolated end of each of the plurality of storage electrodes and a portion thereof connected to storage electrode line formed on the substrate.

4. The thin film transistor array panel of claim 1, wherein the plurality of branches of each storage electrode further comprises two longitudinal branches connected to two oblique branches to form the closed loop.

5. The thin film transistor array panel of claim 1, wherein each storage electrode comprises two longitudinal branches connected to three oblique branches, the connected branches forming two closed loops.

6. The thin film transistor array panel of claim 1, wherein each storage electrode comprises two longitudinal branches connected to four oblique branches, the connected branches forming three closed loops.

7. The thin film transistor array panel of claim 1, wherein the pixel electrode has a plurality of cutouts, and at least one of the cutouts overlaps the storage electrode.

8. The thin film transistor panel of claim 1, wherein the data conductor has substantially the same planar shape as the semiconductor layer except for a channel portion of the semiconductor layer.

9. A thin film transistor array panel, comprising:
   an insulating substrate;
   a gate line formed on the substrate;
   a plurality of storage electrodes formed on the substrate, each storage
   electrode including a plurality of branches;
   a gate insulating layer formed on the gate line and the storage electrode;
   a semiconductor layer formed on the gate insulating layer;
   a data conductor formed on the semiconductor layer;
   a passivation layer formed on the data conductor; and
   a pixel electrode layer formed on the passivation layer,
      wherein at most one of the branches of each storage electrode has an isolated end, and
      wherein longitudinal portions of adjacent storage electrodes are connected by connecting portions.

10. The thin film transistor array panel of claim 9, further comprising a connection bridge having a portion thereof connected to each of the isolated ends of the plurality of storage electrodes and a portion thereof connected to a storage electrode line formed on the substrate.

11. The thin film transistor array panel of claim 9, wherein each storage electrode further comprises two longitudinal branches and two oblique branches, and the branches of each storage conductor form a closed loop.

12. The thin film transistor array panel of claim 9, wherein each storage electrode comprises two longitudinal branches connected to three oblique branches, the connected branches forming two closed loops.

13. The thin film transistor array panel of claim 9, wherein each storage electrode comprises two longitudinal branches connected to four oblique branches, the connected branches forming three closed loops.

14. The thin film transistor array panel of claim 9, wherein the pixel electrode has a plurality of cutouts, and at least one of the cutouts overlaps the storage electrode.

15. The thin film transistor array panel of claim 9, wherein the data conductor has substantially the same planar shape as the semiconductor layer except for a channel portion of the semiconductor layer.

* * * * *